(12) United States Patent
Proebsting

(10) Patent No.: US 6,326,839 B2
(45) Date of Patent: Dec. 4, 2001

(54) APPARATUS FOR TRANSLATING A VOLTAGE

(75) Inventor: Robert J. Proebsting, Los Altos Hill, CA (US)

(73) Assignee: Townsend and Townsend and Crew LLP, San Francisco, CA (US)

(*) Notice: Subject to any disclaimer, the term of this patent is extended or adjusted under 35 U.S.C. 154(b) by 0 days.

(21) Appl. No.: 09/732,793

(22) Filed: Dec. 7, 2000

Related U.S. Application Data

(62) Division of application No. 09/516,399, filed on Mar. 1, 2000, which is a division of application No. 08/882,564, filed on Jul. 3, 1997, now Pat. No. 6,064,250
(60) Provisional application No. 60/022,724, filed on Jul. 29, 1996.

(51) Int. Cl.[7] .................................................. G05F 1/10
(52) U.S. Cl. .................................... 327/589; 327/333
(58) Field of Search .................................. 327/536, 589, 327/537, 543, 538, 333

(56) References Cited

U.S. PATENT DOCUMENTS

| | | | |
|---|---|---|---|
| 4,336,466 | 6/1982 | Sud et al. | 307/297 |
| 4,455,493 | 6/1984 | Morton et al. | 307/296 |
| 4,705,966 | 11/1987 | Van Zanten | 307/296 |
| 4,710,647 | 12/1987 | Young | 307/297 |
| 4,733,108 | 3/1988 | Truong . | |
| 4,754,168 | 6/1988 | Liran | 307/296 |
| 4,883,976 | 11/1989 | Deane | 307/291.2 |
| 4,920,280 | 4/1990 | Cho et al. | 307/296.02 |
| 4,964,082 | 10/1990 | Sato et al. | 365/189.09 |
| 5,003,197 | 3/1991 | Nojima et al. | 307/296.2 |
| 5,038,325 | 8/1991 | Douglas et al. | 365/189.06 |
| 5,111,375 | 5/1992 | Marshall | 363/60 |
| 5,121,014 | 6/1992 | Huang . | |
| 5,126,590 | 6/1992 | Chern . | |
| 5,172,013 | 12/1992 | Matsumura | 307/296.2 |
| 5,179,296 | 1/1993 | Ito | 307/296.2 |
| 5,184,030 | 2/1993 | Chung et al. | 307/296.02 |
| 5,227,675 | 7/1993 | Taguchi | 327/537 |
| 5,243,228 | 9/1993 | Maruyama et al. | 307/296.2 |
| 5,266,842 | 11/1993 | Park | 307/296.2 |
| 5,315,166 | 5/1994 | Arimoto | 307/296.2 |
| 5,329,168 | 7/1994 | Sugibayashi | 307/296.1 |
| 5,343,087 | 8/1994 | Furuyama | 307/296.2 |
| 5,343,088 | 8/1994 | Jeon | 307/296.2 |
| 5,347,171 | 9/1994 | Cordoba et al. | 307/296.2 |

(List continued on next page.)

FOREIGN PATENT DOCUMENTS

| | | |
|---|---|---|
| 0 463 545 | 2/1992 | (EP) . |
| 0 576 008 | 12/1993 | (EP) . |
| 0 669 619 A2 | 2/1995 | (EP) . |

*Primary Examiner*—Jung Ho Kim
(74) *Attorney, Agent, or Firm*—Townsend and Townsend and Crew LLP

(57) ABSTRACT

A low voltage current source generates low voltage signals for powering a variable frequency oscillator. The low voltage signals are at a slightly higher voltage until a negative substrate bias is achieved. The oscillator operates at a low frequency for low power consumption when no charge pumping is needed and at a higher frequency when charge pumping is in fact needed or when charge pumping will most likely be needed. The variable frequency oscillator controls a timing signal generator which generates the timing signals used to control the overall operation of the charge pump system. Voltage translation circuitry translates the low voltage current source signals into higher voltage signals which are used to translate the substrate voltage from its negative value to a positive value so that the substrate voltage may be compared to a reference voltage using a conventional comparator. When the substrate voltage is above the desired level, the comparator generates a pump activating signals to a pump signal generator which, in turn, generates the necessary signal to cause the charge pump to operate.

27 Claims, 10 Drawing Sheets

U.S. PATENT DOCUMENTS

| | | | |
|---|---|---|---|
| 5,394,027 | 2/1995 | Park | 327/536 |
| 5,422,586 | 6/1995 | Tedrow et al. | 327/306 |
| 5,483,152 | 1/1996 | Hardee et al. | 323/314 |
| 5,532,640 | 7/1996 | Okunaga | 327/536 |
| 5,537,072 | 7/1996 | Canclini | 327/374 |
| 5,546,296 | 8/1996 | Savignac | 363/60 |
| 5,557,231 | 9/1996 | Yamaguchi et al. | 327/534 |
| 5,561,385 | 10/1996 | Choi | 327/536 |
| 5,592,120 | 1/1997 | Palmer et al. | 327/536 |
| 5,650,671 | 7/1997 | Pascucci et al. | 307/110 |
| 5,670,907 | 9/1997 | Gorecki et al. | 327/535 |
| 5,721,509 | 2/1998 | Taft et al. | 327/530 |
| 5,783,956 | 7/1998 | Ooishi | 327/276 |
| 5,790,393 | 8/1998 | Fotouhi | 327/536 |

APPARATUS FOR TRANSLATING A VOLTAGE

This application is a divisional of and claims the benefit of U.S application Ser. No. 09/516,399, filed Mar. 1, 2000, which is a divisional of U.S. application Ser. No. 08/882,564, filed Jul. 3, 1997, now U.S. Pat. No. 6,064,250, which claims the benefit of U.S. Provisional Application No. 60/022,724, filed Jul. 29, 1996.

BACKGROUND OF THE INVENTION

This invention relates to electronic circuitry and, more particularly, to a charge pump for producing a negative substrate bias in a complementary metal oxide semiconductor (CMOS) integrated circuit.

MOS transistors are commonly used in electronic circuits such as dynamic random access memories (DRAMS). In an NMOS transistor, an N-type source region is separated from an N-type drain region by a P-type channel region. All three regions are formed in a P-type semiconductor substrate. By applying a positive voltage to a gate electrode disposed above the channel region, electrons gather in the channel region between the source region and the drain region to allow current to flow from the drain region to the source region. PMOS transistors have the same structure except the conductivity types of the various regions are reversed and a negative gate voltage is required to allow current to flow from the source region to the drain region.

It has been found that NMOS transistors operate better when the P-type substrate of the NMOS (or of the NMOS transistors in a CMOS circuit) is driven negative with respect to circuit ground, in other words there is a negative substrate bias. Such a negative substrate bias provides a number of advantages in terms of the overall circuit performance. More specifically, a negative substrate bias decreases the NMOS transistor source and drain capacitance, decreases the likelihood of latchup, decreases PN diode injection when a node is driven below ground, and decreases the effective body effect, all of which are desirable in CMOS circuits.

Typically a charge pump circuit is used to create the negative substrate bias. Once a negative substrate bias is achieved, however, it does not last forever. For example, when an NMOS transistor is conductive with a relatively high drain to source voltage, some of the electrons traveling from the source region to the drain region collide with atoms in the channel region with enough energy to cause electron/hole pairs to form. The positive gate voltage attracts the generated electrons to the surface of the channel while the positive drain voltage attracts them to the drain where they simply add to the normal flow of electrons from source to drain. The positively charged holes, by contrast, are repelled by the positively charged gate away from the channel region into the substrate. The substrate current created by the excess holes makes the substrate more positively charged, thus counteracting the negative substrate bias. In DRAMS, a substantial amount of substrate current is generated whenever the memory is read or written, since many transistors are switched on and off at that time. This component of substrate current may be orders of magnitude above the background (i.e., standby) leakage current of all the reverse biased P-N diodes throughout the circuit. Therefore, the charge pump must remove low substrate current during standby and high substrate current during high activity to maintain the negative substrate bias.

FIG. 1 is a conceptual schematic diagram of a charge pump 2 which includes a first switch 4 coupled between a positive power supply voltage ($V_{cc}$) and a first terminal 6 of a capacitance C1. A second switch 8 is coupled between a ground potential ($V_{ss}$) and a second terminal 10 of capacitance C1. A third switch 12 is coupled between ($V_{ss}$) and terminal 6 of capacitance C1, and a fourth switch 14 is coupled between the substrate (represented by the voltage ($V_{bb}$)) and terminal of capacitance C1. In operation, switches 4 and 8 are both closed (made conductive) for charging capacitance C1 to a voltage equal to the difference between ($V_{cc}$) and ($V_{ss}$). In FIG. 1, ($V_{cc}$)=+5 volts and ($V_{ss}$)=0 volts, so capacitance C1 charges with node 6 five volts more positive than node 10. Thereafter, switches 4 and 8 are opened and switches 12 and 14 are both closed. Since the positive terminal 6 of capacitance C1 is now coupled to a ground potential, the negative terminal 10 of capacitance C1 tries to drive $V_{bb}$ to negative 5 volts through switch 14. Thereafter, switches 12 and 14 are opened, and the sequence repeats itself. An oscillator (not shown) typically controls the repetitive switching sequence, and a detector (not shown) monitors the substrate voltage and controls the pumping operation to maintain the substrate at the proper negative voltage level.

As discussed in more detail below, known charge pumps consume a substantial amount of power (often 1 milliwatt or more even when no further pumping is required), often work against themselves by adding positive substrate current as they operate, and generally operate inefficiently.

SUMMARY OF THE INVENTION

The present invention is directed to a charge pump which consumes only a very small amount of power (approximately 50 microwatts or less in the exemplary embodiment described herein when no additional pumping is required). The charge pump according to the present invention does not add substrate current as it operates, and operates more efficiently than known charge pumps. In one embodiment of the present invention, a low voltage regulator on the integrated circuit generates a low voltage supply on the integrated circuit for powering a variable frequency oscillator, whose nodes oscillate between ground and the regulated low voltage supply of, for example, about 1.5 volts. The low voltage regulator provides a slightly higher voltage until some negative substrate bias is achieved, assuring proper start-up operation of the oscillator. The low voltage supply dramatically reduces power consumption of the oscillator compared to known oscillators. The oscillator operates at a low frequency for low power consumption when no charge pumping is needed (i.e., when the substrate voltage is at or below the desired negative bias voltage level and the circuit is in standby), and operates at a much higher frequency when charge pumping is needed or likely will be needed. For example, the charge pump will be needed when the substrate voltage is more positive than the desired negative bias voltage level, and may be needed when the integrated circuit is operating in a mode which typically generates high substrate currents. The variable frequency oscillator controls a timing signal generator which generates the timing signals used to control the overall operation of the charge pump.

Voltage translation circuitry translates the negative substrate voltage into a positive voltage signal (e.g., between 0 and +5 volts). This allows the (translated) substrate voltage to be compared to a positive reference voltage using a conventional comparator, without adding substrate current as it operates. When the substrate voltage is more positive than the desired level, the comparator generates a pump activating signal to a pump signal generator which turns on the charge pump.

In one embodiment, the charge pump itself uses an NMOS transistor to perform the switching function of switch 14 of FIG. 1 in a configuration that neither loses a threshold voltage when conducting nor allows P-N diode injection into the substrate when node 6 of capacitor C1 is driven low by switch 12. Likewise, all other switches 4, 8, and 14 do not exhibit a threshold voltage drop. In an exemplary embodiment, the one-stage pump of the present invention is capable of pumping the substrate to a voltage of −4.9 volts when operating from a supply of +5.0 volts (with the regulator disabled).

A better understanding of the nature and advantages of the charge pump circuit of the present invention may be had with reference to the detailed description and the drawings below.

DETAILED DESCRIPTION OF SPECIFIC EMBODIMENTS

OVERVIEW

Figure 2:
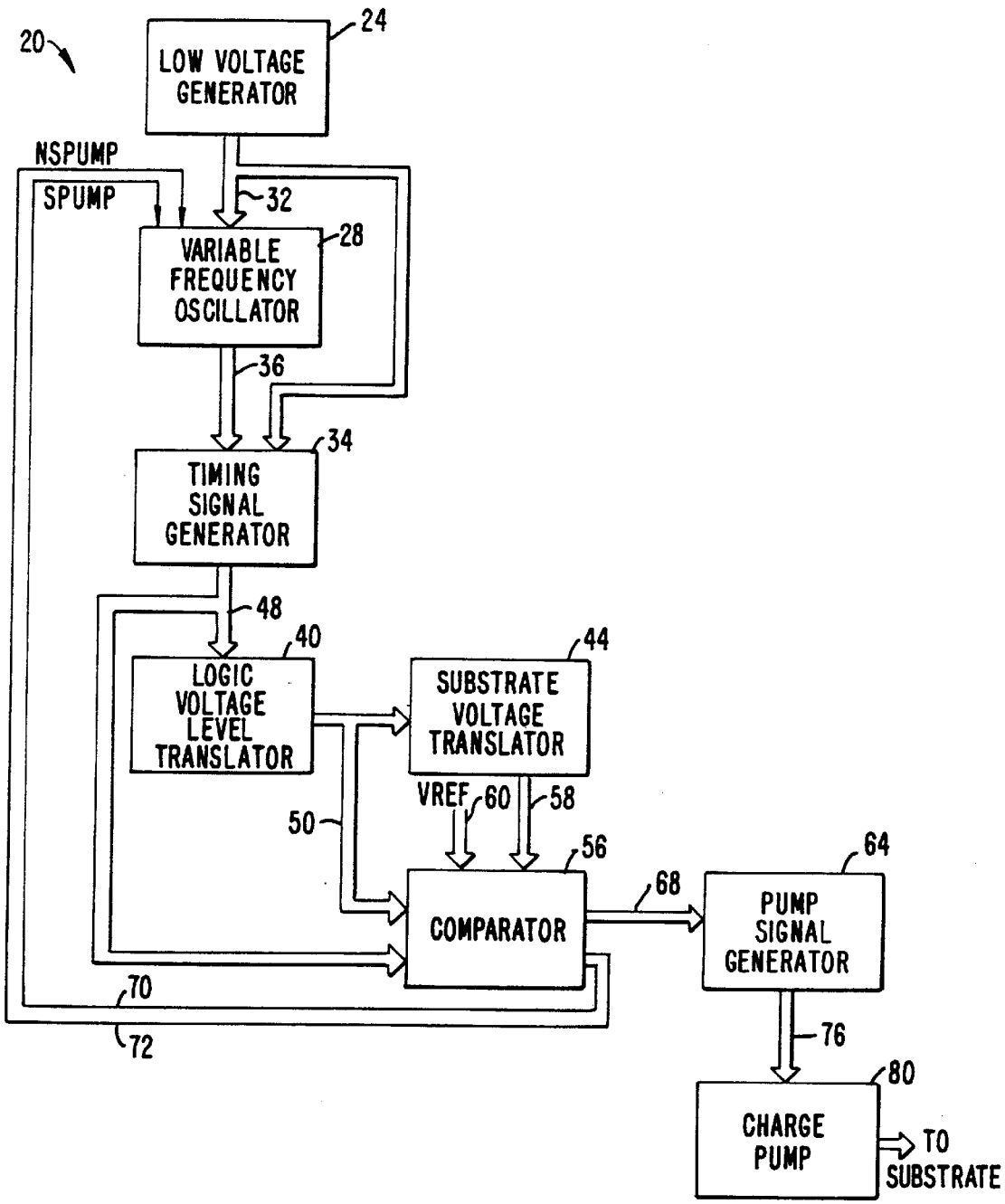
FIG. 2 is a block diagram of a particular embodiment of a charge pumping system according to the present invention.

FIG. 2 is a block diagram of a particular embodiment of a substrate charge pumping system 20 according to the present invention. A low voltage generator 24 provides a reduced potential source (for power saving) through bus 32 to power a variable (e.g., dual) frequency oscillator 28 and timing signal generator 34. Variable frequency oscillator 28 provides oscillation signals of high or low frequency through a bus 36 to timing signal generator 34. High frequency is for fast pumping and low frequency is for reduced power. In response, timing signal generator 34 provides timing signals to control the operation of the remaining portions of the circuit. In particular, generator 34 provides timing signals to logic voltage level translator 40, comparator 56 and substrate voltage translator 44 through bus 48.

Logic level voltage translator 40 translates the low voltage signals, for example 0 to +1.5 volts, produced by oscillator 28 and timing generator 34 into higher voltage signals, of for example 0 to +5 volts. The higher voltage signals are supplied to comparator 56 through a bus 50. Substrate voltage translator 44 translates the substrate voltage from a level below ground to a level above ground and supplies the translated voltage to comparator 56 through a bus 58. Comparator 56 compares the translated voltage received on bus 58 to a reference voltage received on a bus 60 and provides, when needed, pump activating signals to a pump signal generator 64 through a bus 68. Comparator 56 also provides complimentary SPUMP/NSPUMP (Slow pump/Not Slow pump=Low Frequency/Not Low Frequency) signals on SPUMP signal line 70 and NSPUMP signal line 72 to oscillator 28. The SPUMP and NSPUMP signals are used to control the frequency of the oscillator. Pump signal generator 64 generates timing signals on a bus 76 for controlling the operation of a charge pump 80. Charge pump 80 creates and maintains a negative substrate bias. Charge pump 80 uses special circuitry which does not experience an undesirable threshold drop in any diode-connected transistor.

OSCILLATOR

Figure 3:
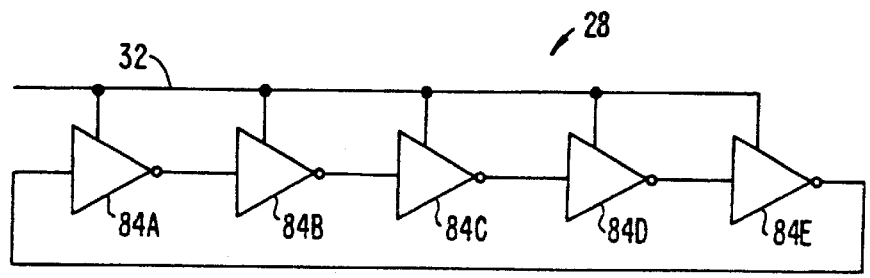
FIG. 3 is a block diagram of a particular embodiment of the variable frequency oscillator shown in FIG. 2.

FIG. 3 is a block diagram of a particular embodiment of a dual frequency free-running oscillator 28. Oscillator 28 comprises an odd number of oscillator stages 84A–E in the form of inverters. The output terminal of each oscillator stage is coupled to the input terminal of the next oscillator stage, and the output terminal of oscillator stage 84E is coupled to the input terminal of oscillator stage 84A, thus forming a ring oscillator. The ring oscillator generates a free-running oscillating signal as each node in the ring alternates a logic "1" and a logic "0". Each oscillator stage 84A–E is coupled to bus 32 for receiving power from source 24 (not shown).

Figure 4:
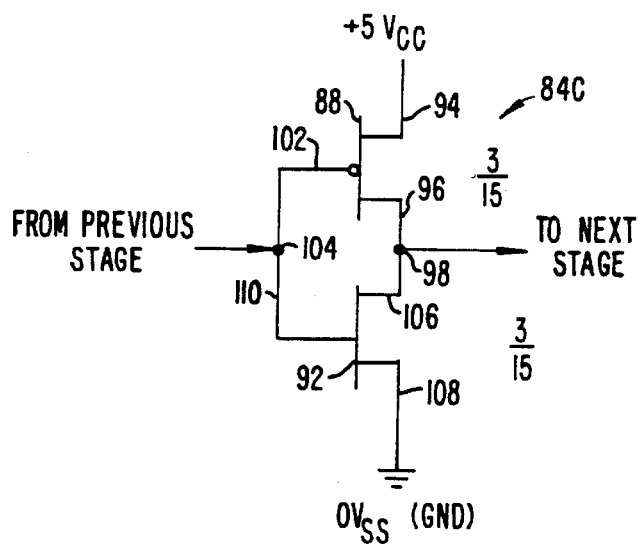
FIG. 4 is a schematic diagram of a known oscillator stage.

FIG. 4 is a schematic diagram of a known oscillator stage suitable for use as oscillator stages 84A–E. The oscillator stage comprises a PMOS transistor 88 coupled to an NMOS transistor 92. The source terminal 94 of transistor 88 is coupled to $V_{cc}$, the drain terminal 96 is coupled to output node 98, and the gate terminal 102 is coupled to input node 104. Node 104 receives signals from the output node of the previous stage, i.e., stage 84B, if this is stage 84C. NMOS transistor 92 has its drain terminal 106 coupled to output node 98, its source terminal 108 coupled to $V_{ss}$, and its gate terminal 110 coupled to input node 104.

The operation of the stage is described below using exemplary values of −5 volts and ground (0 volts) for $V_{cc}$ and $V_{ss}$, respectively. Assume PMOS transistor 88 has a threshold voltage $|V_{tp}|$ of approximately 0.7 volts below its source voltage and NMOS transistor 92 has a threshold voltage $V_{tn}$ of approximately 0.8 volts above its source voltage. When input node 104 is at 0 volts, PMOS transistor 88 is on, NMOS transistor 92 is off, and output node 98 is at +5 volts. When the potential at input node 104 rises above +0.8 volts, NMOS transistor 98 turns on. When the potential at input node 104 reaches or exceeds +4.3 volts, PMOS transistor 88 turns off. Thereafter, only NMOS transistor 92 conducts, and output node 98 is at 0 volts. The reverse occurs as the voltage at input node 104 swings from +5 volts to 0 volts.

The problem with this stage is that both PMOS transistor 88 and NMOS transistor 92 simultaneously conduct during the time the input node 104 is between +0.8 volts and +4.3 volts, thus drawing a substantial amount of current, on the order of perhaps one hundred microamps.

According to the present invention, low voltage generator 24 provides a low voltage signal on bus 32 for powering oscillator 28. The low voltage is equal to the sum of the absolute magnitudes of the threshold voltages $V_{tn}$ and $V_{tp}$. Using the values of $V_{tp}$ and $V_{tn}$ noted above, source terminal 94 of PMOS transistor 88 is coupled to a +1.5 volt potential rather than a +5 volt potential, according to the present invention. Therefore, when input node 104 is at 0 volts, PMOS transistor 88 conducts, NMOS transistor 92 is off, and output node 98 is at +1.5 volts. When the voltage at input node 104 rises to +0.8 volts, NMOS transistor 92 turns on, and PMOS transistor 88 turns off. As the voltage at input node 104 continues to rise to +1.5 volts, only NMOS transistor 92 conducts. Because PMOS transistor 88 and NMOS transistor 92 do not conduct at the same time while the voltage at input node 104 swings between 0 and +1.5 V, the excessive power consumption of known inverter stages is eliminated. Additionally, operating these transistors at a low voltage means less charge is needed to charge and discharge the gates, thus further reducing power consumption. The logic of timing signal generator 34 also operates at low voltage to save power.

LOW VOLTAGE GENERATOR

Figure 5:
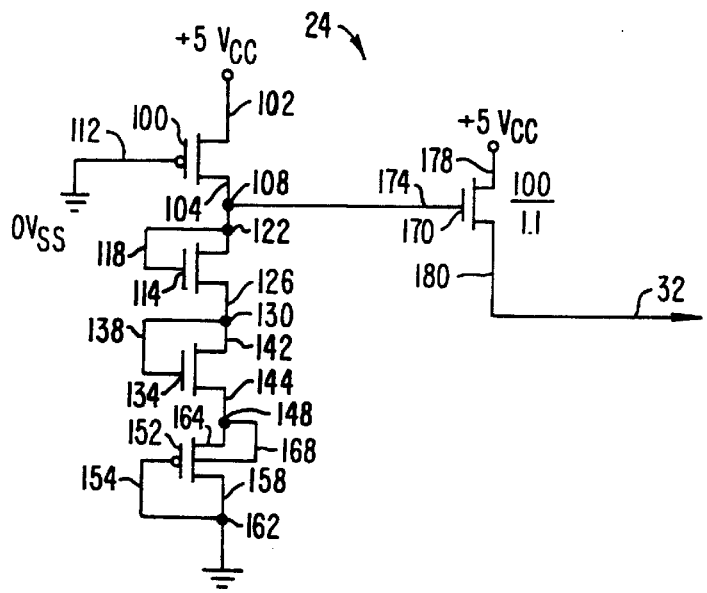
FIG. 5 is a schematic diagram of a particular embodiment of the low voltage generator shown in FIG. 2.

FIG. 5 is a schematic diagram of a particular embodiment of low voltage generator 24. A very narrow, very long channel, and thus weak, PMOS transistor 100 has a source terminal 102 coupled to ($V_{cc}$), a drain terminal 104 coupled to a node 108, and a gate terminal 112 coupled to ($V_{ss}$). A moderately wide, short channel NMOS transistor 114 has a gate terminal 118 and drain terminal 122 together coupled to node 108 and a source terminal 126 coupled to a node 130. Another similar NMOS transistor 134 has a gate terminal 138 and a drain terminal 142 together coupled to node 130 and a source terminal 144 coupled to a node 148. A moderately wide, short channel PMOS transistor 152 has a source terminal 164 coupled to node 148 and to its N Well (schematically represented by a line 168). A gate terminal 154 and a drain terminal 158 of PMOS transistor 152 is coupled to a node 162 which, in turn, is coupled to ($V_{ss}$).

In operation, transistors 100, 114, 134 and 152 form a voltage divider. Transistor 100 provides a very small current through diode-connected transistors 114, 134 and 152, each of which support this small current with a voltage slightly over that transistor's threshold voltage. Therefore, the voltage at node 162 is 0 volts, the voltage at node 148 is $|V_{tp}|$ volts, the voltage at node 130 is $|V_{tp}|+V_{tn}$ volts, and the voltage at node 108 is $|V_{tp}|+V_{tn}+V_{tn}$ volts.

A wide, short channel NMOS transistor 170 has a gate terminal 174 coupled to node 108, a drain terminal 178 coupled to ($V_{cc}$), and a source terminal 180 coupled to bus 32. Transistor 170 is connected as a source follower, so the voltage on bus 32 is one NMOS threshold voltage below the voltage on node 108. Thus, the voltage on bus 32 is $|V_{tp}|+(V_{tn})$ or +1.5 volts for the values noted above.

Figure 6:
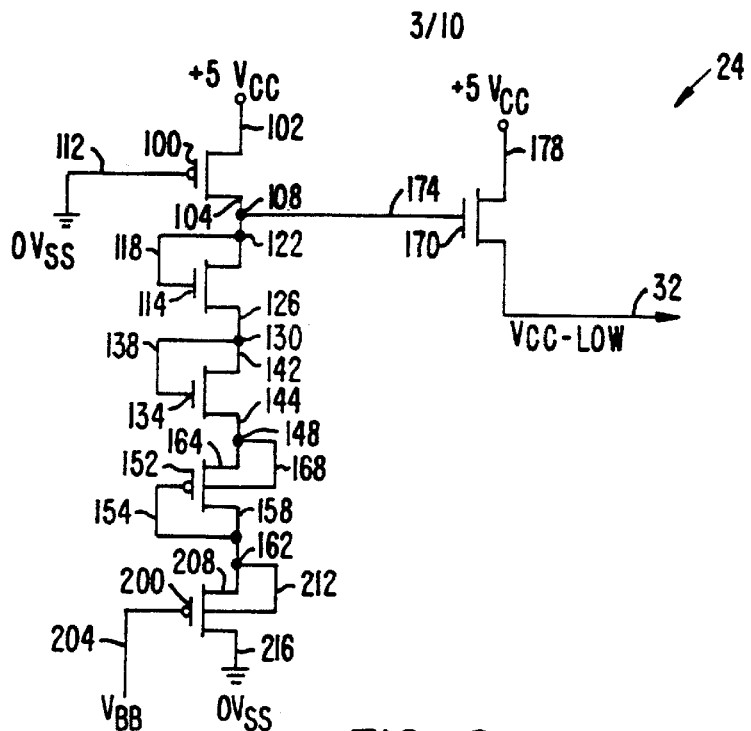
FIG. 6 is a schematic diagram of an alternative embodiment of the low voltage generator shown in FIG. 5.

Because the preferred embodiment uses a low voltage signal to power oscillator 28, oscillator 28 may malfunction if, for example, NMOS transistor 92 is in depletion mode with a negative threshold voltage. This could happen only in the absence of a negative substrate voltage; that is before the pump establishes the negative substrate bias. Consequently, an alternative embodiment of low voltage power supply 24 shown in FIG. 6 may be employed to ensure proper operation of oscillator 28. The only difference between the circuit shown in FIG. 6 and the one shown in FIG. 5 is the addition of a moderately wide, short channel PMOS transistor 200 disposed between node 162 and ($V_{ss}$). As shown in FIG. 6, PMOS transistor 200 has a gate terminal 204 coupled to the substrate (designated by the substrate voltage ($V_{bb}$)), a source terminal 208 coupled to node 162 and to its N Well (represented by a line 212), and a drain terminal 216 coupled to ($V_{ss}$).

Before the substrate has a negative bias, the gate of PMOS transistor 200 is equal to 0 volts, and the current through transistor 200 causes node 162 to be one PMOS threshold voltage above $V_{ss}$. The voltage at node 108 is $|V_{tp}|+|V_{tp}|+(V_{tn})+(V_{tn})$ producing a voltage of $|V_{tp}|+|V_{tp}|+(V_{tn})$ on bus 32. This higher voltage is sufficient to ensure proper operation of each oscillator stage, even if the NMOS transistors have a slightly negative threshold voltage. Once the charge pump begins pumping and a negative substrate bias is established, the higher voltage on bus 32 is no longer needed. As $V_{bb}$ goes negative, source follower PMOS transistor 200 pulls node 162 to ($V_{ss}$). This produces the $|V_{tp}|+(V_{tn})+(V_{tn})$ voltage at node 108 and the low $|V_{tp}|+(V_{tn})$ voltage on bus 32 to minimize power consumption after initial start up.

DUAL FREQUENCY OSCILLATOR

In known systems, charge pumping is often accomplished using two separate charge pumps. A smaller charge pump consuming lower power is activated during periods of low substrate current, and both it and a larger charge pump is activated during periods of high substrate current. Using a DRAM as an example, the smaller charge pump is used when the memory is in standby mode, and both pumps are used whenever the memory is in an active cycle, i.e., read or write. Instead of two separate oscillator circuits, the present invention employs a single charge pump, such that both the pump current into the substrate, as well as the current consumed by the pump may be controlled by varying the frequency of oscillator 28.

Figure 7:
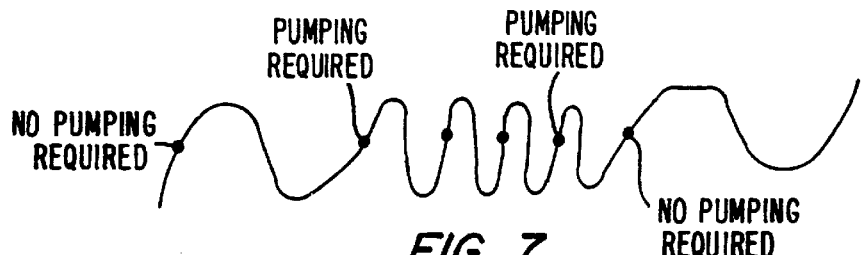
FIG. 7 is a waveform showing the operation of the dual frequency oscillator shown in FIG. 3.

During standby, oscillator 28 generates a relatively low frequency (e.g., ~200 KHz) oscillator signal (see FIG. 7) so that all components in the system consume low power. The substrate voltage is compared to the reference voltage once per cycle (e.g., at the leading edge of each cycle as shown). As long as the substrate voltage is at or below the desired negative substrate bias voltage, oscillator 28 continues operating at this low frequency. When a voltage comparison indicates pumping is required (i.e., the substrate voltage is more positive than the desired negative substrate bias voltage), oscillator 28 switches to a higher frequency (e.g., ~20 MHz) via the signals on SPUMP line 70 and NSPUMP line 72 as discussed below. Additionally, a single pump activating positive pulse is generated by comparator 56 on bus 68 so that charge pump 80 may execute a single pumping cycle as discussed above for FIG. 1. The comparison function still occurs on the leading edge of each oscillator signal, and a corresponding pump activating signal is generated each time comparator 56 determines pumping is required. When comparator 56 determines pumping is no longer needed, it issues the appropriate signals on SPUMP line 70 and NSPUMP line 72 to cause oscillator 28 to return to the low frequency, low power mode. In this embodiment, oscillator 28 also operates at the higher frequency whenever the associated circuit operates in a mode typically associated with high substrate current (e.g., when a DRAM is in an active cycle) whether or not pumping is actually required. Pumping thus occurs on an as-needed basis, and the high frequency mode of oscillator 28 allows charge pump 80 to accommodate high substrate current conditions.

Figure 8:
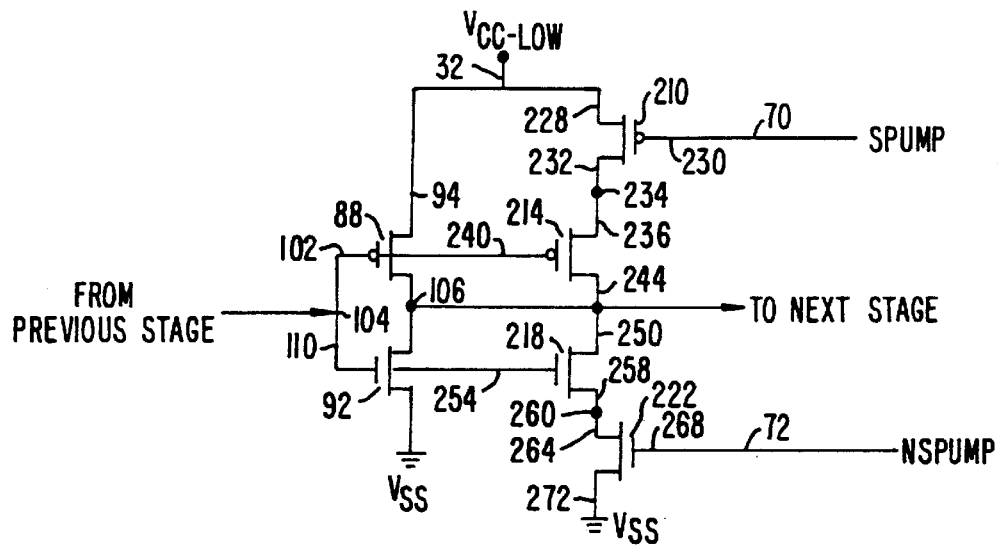
FIG. 8 is a schematic diagram of a particular embodiment of a variable frequency oscillator stage shown in FIG. 3.

Dual frequency operation of oscillator 28 is accomplished by adding transistors 210, 214, 218, and 222 as shown in FIG. 8 to the basic oscillator structure shown in FIG. 4. Each of the transistors 210, 214, 218 and 222 is moderately narrow, short channel PMOS transistor transistors. 210 has a source terminal 228 coupled to source terminal 94 of PMOS transistor 88 (which, in this embodiment, is a very narrow, long channel transistor), a gate terminal 230 coupled to SPUMP (Slow Pump) line 70, and a drain terminal 232 coupled to a node 234. PMOS transistor 214 has a source terminal 236 coupled to node 234, a gate terminal 240 coupled to gate terminal 102 of PMOS transistor 88, and a drain terminal 244 coupled to node 106. NMOS transistor 218 has a drain terminal 250 coupled to node 106, a gate terminal 254 coupled to gate terminal 110 of NMOS transistor 92 (which, in this embodiment, is a very narrow, long channel transistor), and a source terminal 258 coupled to a node 260. Finally, NMOS transistor 222 has a drain terminal 264 coupled to node 260, a gate terminal 268 coupled to NSPUMP (Not Slow Pump) line 72, and a source terminal 272 coupled to ($V_{ss}$).

The signals on lines 70 and 72 are complementary signals and occur so that either transistors 210 and 222 are simultaneously on or simultaneously off. Oscillator 28 operates at a lower frequency determined by the very high resistances of transistors 88 and 92 whenever transistors 210 and 222 are off, and oscillator 28 operates at a much higher frequency determined by the much lower combined resistances of transistors 88, 92, 214, 218, 210, and 222 whenever transistors 210 and 222 are on. High frequency operation occurs because the relatively wide, short channel (low resistance) transconductance transistors 214 and 218 provide high current and pull node 106 high and low much faster than the relatively narrow, very long channel (high resistance) transconductance transistors 88 and 92. The high frequency is perhaps 20 MHz and the low frequency is perhaps 200 KHz.

As discussed above with reference to FIG. 8, initially oscillator 28 operates in the low frequency mode. When comparator 56 detects the substrate voltage being above the desired negative bias voltage level, and during periods of possibly high substrate current, the signals are provided on SPUMP line 70 and NSPUMP line 72 for turning transistors 210 and 222 on. This causes the oscillator signal to occur at a much higher frequency as shown by the center portion of the wave-form in FIG. 7 (not to scale), and with a smooth transition between the low and high frequency modes. When pumping is not required and the associated circuit is not operating in a mode typically associated with high substrate current, the signals are provided on SPUMP line 70 and NSPUMP line 72 for turning transistors 210 and 222 off. Oscillator 28 then reverts to its low frequency mode, again with a smooth transition between the modes.

TIMING SIGNAL GENERATOR

Figure 9:
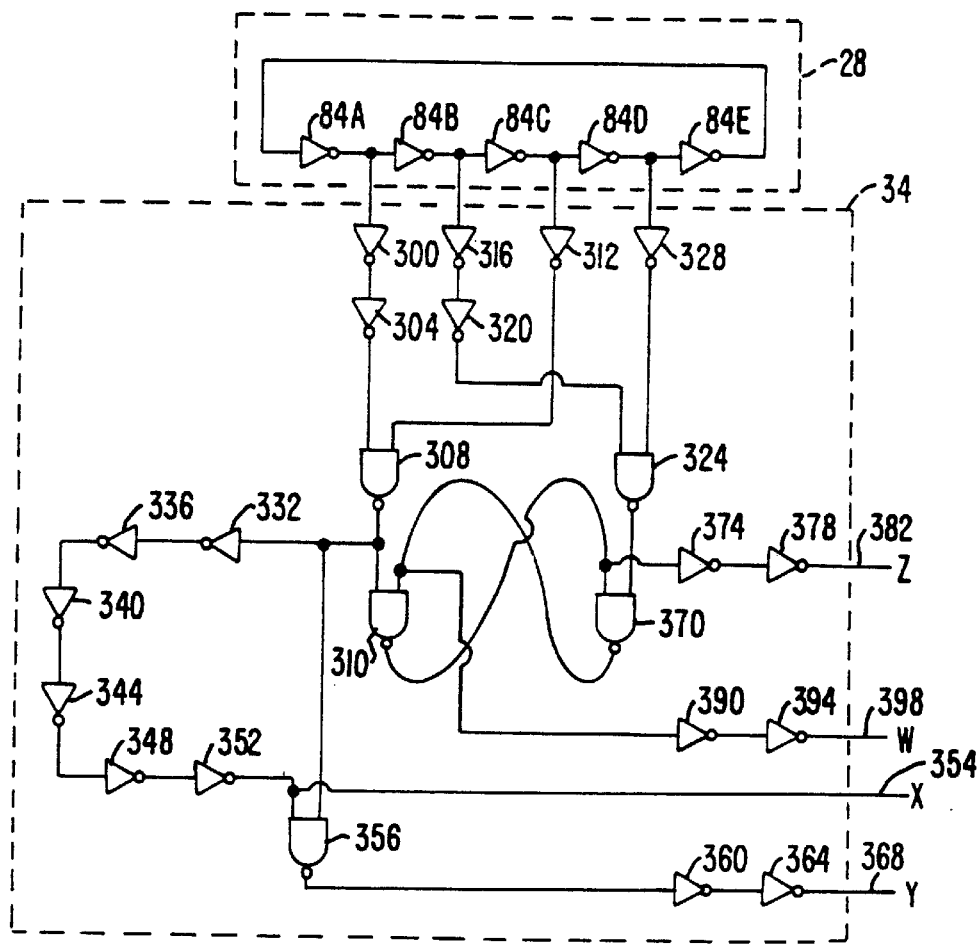
FIG. 9 is a schematic diagram of a timing signal generator shown in FIG. 2.

FIG. 9 is a schematic diagram showing the construction of timing signal generator 34 and how it is coupled to dual frequency oscillator 28. To save power, all of the circuitry shown in FIG. 9 operates preferably from the reduced power supply voltage provided by low voltage generator 24. Timing signal generator 34 includes an inverter 300 having an input terminal coupled to the output terminal of inverter 84A in oscillator 28 and an output terminal coupled to an input terminal of an inverter 304. The output terminal of inverter 304 is coupled to one input terminal of a 2-input NAND gate 308. The other input terminal of NAND gate 308 is coupled to the output terminal of an inverter 312 which, in turn, has an input terminal coupled to an output terminal of inverter 84C in oscillator 28.

Similarly, an inverter 316 has an input terminal coupled to the output terminal of inverter 84B in oscillator 28 and an output terminal coupled to an input terminal of an inverter 320. The output terminal of inverter 320 is coupled to one input terminal of a 2-input NAND gate 324. The other input terminal of NAND gate 324 is coupled to an output terminal of an inverter 328 which, in turn, has an input terminal coupled to an output terminal of inverter 84D in oscillator 28.

The output terminal of NAND gate 308 is coupled to an input terminal of an inverter 332, to one input terminal of a 2-input NAND gate 310, and to one input terminal of a 2-input NAND gate 356. The output terminal of inverter 332 is coupled to an input terminal of an inverter 336 which has an output terminal connected to an input terminal of an inverter 340. An output terminal of inverter 340 is coupled to an input terminal of an inverter 344 which has an output terminal coupled to an input terminal of an inverter 348. An output terminal of inverter 348 is coupled to an input terminal of an inverter 352 which has an output terminal coupled to the other input terminal of NAND gate 356 and to an "X" signal line 354.

An output terminal of NAND gate 356 is coupled to a input terminal of an inverter 360 which has an output terminal coupled to an input terminal of an inverter 364. An output terminal of inverter 364 is coupled to a "Y" signal line 368.

An output terminal of NAND gate 310 is coupled to one input terminal of a 2-input NAND gate 370 and to an input terminal of an inverter 374. The other input terminal of NAND gate 370 is coupled to an output terminal of NAND gate 324. An output terminal of inverter 374 is coupled to an input terminal of an inverter 378, and an output terminal of inverter 378 is coupled to a "Z" signal line 382.

An output terminal of NAND gate 370 is coupled to the other input terminal of NAND gate 310 and to an input terminal of an inverter 390. An output terminal of inverter 390 is coupled to an input terminal of an inverter 394, and an output terminal of inverter 394 is coupled to a "W" signal line 398. "X" signal line 354, "Y" signal line 368, "Z" signal line 382, and "W" signal line 398 together comprise bus 48 (FIG. 2).

Figure 10:
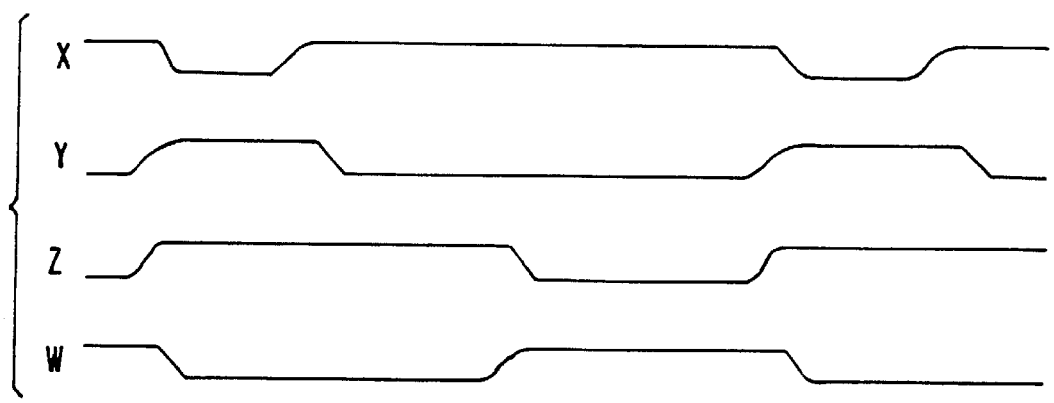
FIG. 10 is a timing diagram illustrating the timing of signals generated by the timing signal generator shown in FIG. 9.

FIG. 10 is a timing diagram showing the sequence of signals on "X" signal line 364, "Y" signal line 368, "Z" signal line 382, and "W" signal line 398, respectively. In general, the signals on the "X" signal line 354 and on the "Y" signal line 368 are complimentary, but with timing such that the signal on "X" signal line 354 goes high before the signal on "Y" signal line 368 goes low and vice versa. The same is true for the signals on "Z" signal line 382 and "W" signal line 398. That is, the signals on the lines each have a high portion (+1.5 volts) and a low portion (0 volts), and the low portions of the signals are mutually exclusive.

LOGIC VOLTAGE LEVEL TRANSLATOR

Figure 13:
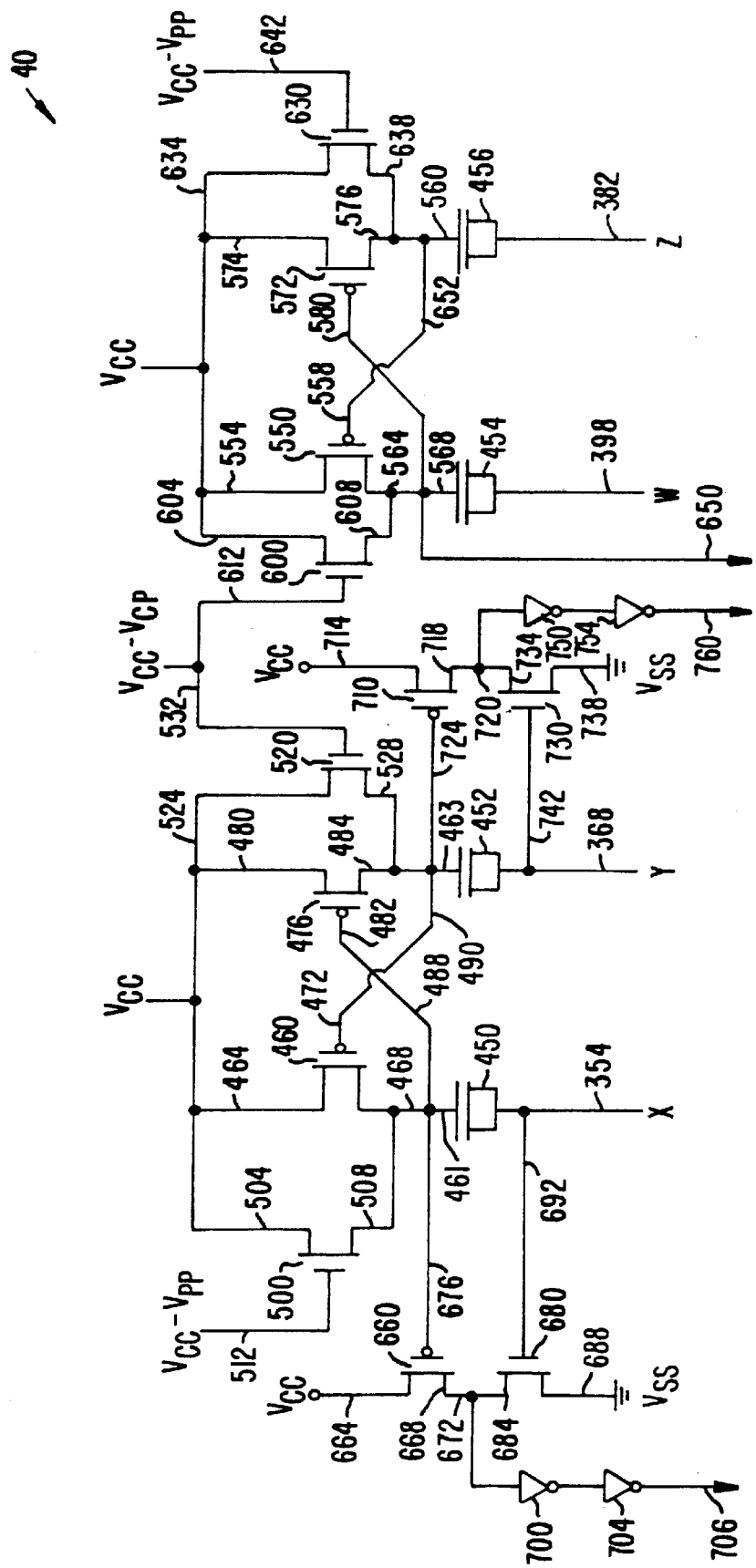
FIG. 13 is a schematic diagram of a particular embodiment of the logic voltage level translator shown in FIG. 2.

FIG. 13 is a schematic diagram of a particular embodiment of logic voltage level translator 40. "X" signal line 354, Y signal line 368, "W" signal line 398 and "Z" signal line 382 are received from timing signal generator 34. The logic voltage level translator receives logic input signals "X", "Y", "W" and "Z", in which the low logic level is $V_{ss}$ (0 volts) and the high logic level is about 1.5 volts. Its purpose is to provide output signals which switch between $V_{ss}$ and $V_{cc}$.

NMOS transistor 450, functioning as a capacitor, has both its source and drain terminals connected to "X" signal line 354 and its gate terminal 461 connected to a node 488. NMOS transistor 452, also functioning as a capacitor, has both its source and drain terminals connected to "Y" signal line 368 and its gate terminal 463 connected to a node 440. NMOS transistor 454, also functioning as a capacitor, has both its source and drain terminals connected to "W" signal line 398 and its gate terminal connected to a node 650. NMOS transistor 456, also functioning as a capacitor, has both its source and drain terminals connected to "Z" signal line 382 and its gate terminal 560 connected to a node 652. A PMOS transistor 460 has a source terminal 464 coupled to ($V_{cc}$), a drain terminal 468 coupled to another terminal 461 of capacitance 450 and a gate terminal 472 coupled to node 490. A PMOS transistor 476 has a source terminal 480 coupled to ($V_{cc}$), a drain terminal 484 coupled to node 490 and a gate terminal 482 coupled to node 488. An NMOS transistor 500 has a drain terminal 504 coupled to ($V_{cc}$), a source terminal 508 coupled to node 488 and a gate terminal 512 coupled to a ($V_{cc}-|V_{tp}|$) volt signal. Similarly, an NMOS transistor 520 has a drain terminal 524 coupled to ($V_{cc}$), a source terminal 528 coupled to node 490, and a gate terminal 532 coupled to the ($V_{cc}-|V_{tp}|$) volt signal.

A PMOS transistor 550 has a source terminal 554 coupled to ($V_{cc}$), a gate terminal 558 coupled to node 652, and a drain terminal 564 coupled to node 650. A PMOS transistor 572 has a source terminal 574 coupled to ($V_{cc}$), a drain terminal 576 coupled to node 652, and a gate terminal 580 coupled to node 650. An NMOS transistor 600 has a drain terminal 604 coupled to ($V_{cc}$), a source terminal 608 coupled to node 650, and a gate terminal 612 coupled to the ($V_{cc}-|V_{tp}|$) volt signal. An NMOS transistor 630 has a drain terminal 634 coupled to ($V_{cc}$), a source terminal 638 coupled to node 652, and a gate terminal 642 coupled to the ($V_{cc}-|V_{tp}|$) volt signal.

A PMOS transistor 660 has a source terminal 664 coupled to ($V_{cc}$), a drain terminal 668 coupled to a node 672, and a gate terminal 676 coupled to node 488. An NMOS transistor 680 has a drain terminal 684 coupled to node 672, a source terminal 688 coupled to ($V_{ss}$), and a gate terminal 692 coupled to "X" signal line 354. Node 672 is coupled to an input terminal of an inverter 700 having an output terminal coupled to an input terminal of an inverter 704. An output terminal of inverter 704 is coupled to a line 706 which provides signals to substrate voltage translator 44.

Similarly, a PMOS transistor 710 has a source terminal 714 coupled to ($V_{cc}$), a drain terminal 718 coupled to a node 720, and a gate terminal 724 coupled to node 490. An NMOS transistor 730 has a drain terminal 734 coupled to node 720, a source terminal 738 coupled to ($V_{ss}$), and a gate terminal 742 coupled to "Y" signal line 368. Node 720 is coupled to an input terminal of an inverter 750 which has an output terminal coupled to an input terminal of an inverter 754. An output terminal of inverter 754 is coupled to a line 760 which provides signals to substrate voltage translator 44. Lines 650, 706, and 760 together comprise bus 50 (FIG. 2).

The function of the part of the logic voltage level translator 40 shown in the left hand part of FIG. 13 is to generate signals that transition from $V_{ss}$ to $V_{cc}$ on nodes 706 and 760 from the low voltage signals "X" and "Y" on signal lines 354 and 368, respectively. The function of the remainder of the logic voltage level translator 40 is to generate a signal on node 650 that transitions between $V_{cc}-1.5$ volts and $V_{cc}$ from the low voltage signals "W" and "Z". Both the left and right portions of the circuitry of FIG. 13 work in the same manner. Nodes "X" on signal line 354 and "Y" on signal line 368 transition between $V_{ss}$ (0 volts) and 1.5 volts, and are generally complements of one another. That is, when one is low the other is high and visa versa. But timing signal generator 34 of FIG. 2 shown in detail in FIG. 9 provides that node "X" will transition high before mode "Y" transitions low and that node "Y" will transition high before node "X" transitions low, as seen in FIG. 10.

Referring again to FIG. 13, when node "Y" transitions low, capacitor (NMOS transistor) 452 drives node 490 low turning on PMOS transistor 460, and pulling node 488 to $V_{cc}$. Throughout this time, node "X" is high at +1.5 volts, and capacitor 450 is charged to 3.5 volts. Next, node "Y" transitions high to +1.5 volts, capacitor 452 drives node 490 high, turning off PMOS transistor 460, but with node 488 remaining at $V_{cc}$. Next, node "X" transitions low from 1.5 volts to 0 volts and capacitor 450 drives node 488 down by 1.5 volts to 1.5 volts below $V_{cc}$, turning on PMOS transistor 476. This pulls node 490 up to $V_{cc}$ at a time when node "Y" is high at +1.5 volts, charging capacitor 452 to 3.5 volts. When node "X" then transitions high, node 488 is again returned to $V_{cc}$, turning off PMOS transistor 476, but with node 490 remaining at $V_{cc}$. This completes one full cycle.

Thus a high level of $V_{cc}$ exists on node 488 when node "X" is high at +1.5 volts and a low level of $V_{cc}-1.5$ volts exists on node 488 when node "X" is at a low level of 0 volts. When node "X" is high at +1.5 volts, NMOS transistor 680 is on and pulls the input of inverter 700 to 0 volts. At this time, node 488 is at $V_{cc}$ so PMOS transistor 660 is off and no current flows through transistors 660 and 680. When node "X" is low at 0 volts, node 488 is low at $V_{cc}-1.5$ volts, turning on PMOS transistor 660 and pulling the input of inverter 700 to $V_{cc}$. At this time, NMOS transistor 680 is off and again no current flows through transistors 660 and 680.

Thus, this circuitry generates on the input of inverter 700 a full logic swing between $V_{ss}$ and $V_{cc}$ from low level inputs on nodes "X" and "Y", and does so without establishing any current path from $V_{cc}$ to $V_{ss}$. Logically, output 706 of the logic voltage level translator of FIG. 13 is a high level compliment of the low level signal on node "X". If node "X" instead went directly to a normal inverter whose PMOS source voltage was +5 volts, the inverter would consume substantial power whenever node "X" is at +1.5 volts. In an identical manner, the low-level signal on node "Y" generates its compliment as a high level signal on node 760.

NMOS transistors 500 and 520 are used to start the circuit when power is first applied, and are not needed or functional thereafter. Each establishes a voltage of at least $V_{cc}-|V_{tp}|-V_{tn}=V_{cc}-1.15$ volts on its respective node 488 or 490, sufficient to establish a channel in each of NMOS transistors (capacitors) 450 and 452, which in turn causes the circuit to function as described above.

The circuitry on the right side of FIG. 13 translates the 0 to +1.5 volt logic levels on node "W" to $V_{cc}-1.5$ to $V_{cc}$ volt logic levels on node 650. These levels on node 650 will be used to turn on or off a PMOS transistor whose source is at $V_{cc}$. This circuitry functions in an identical manner to the corresponding portions of the circuitry on the left side of FIG. 13 already described.

SUBSTRATE VOLTAGE COMPARISON OVERVIEW

A discussion of a known substrate voltage detector is in order to appreciate the inventive aspects of some of the remaining portions of the charge pumping system of the present invention.

Figure 11:
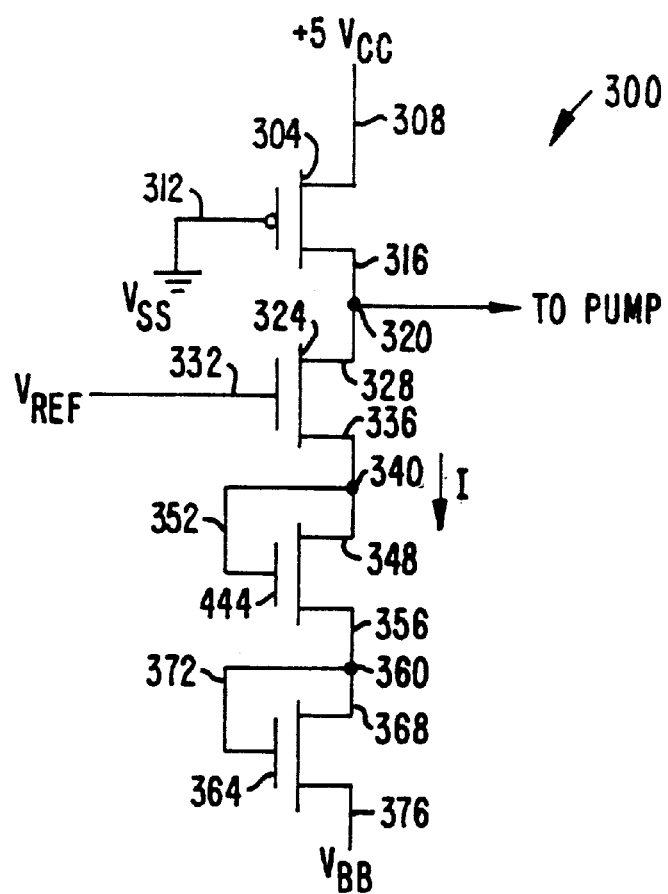
FIG. 11 is a schematic diagram of a known substrate voltage comparator.

FIG 11 is a schematic diagram of a known substrate voltage comparator 300. Voltage comparator 300 includes a very narrow, very long channel PMOS transistor 304 having a source terminal 308 coupled to ($V_{ss}$), a gate terminal 312 coupled to ($V_{ss}$), and a drain terminal 316 coupled to a node 320. Transistor 304 functions as a very high resistance or very low current source. An NMOS transistor 324 has a drain terminal 328 coupled to node 320, a gate terminal 332 coupled to a reference voltage $V_{ref}$ (typically ground), and a source terminal 336 coupled to a node 340. An NMOS transistor 344 has a drain terminal 348 and a gate terminal 352 together coupled to node 340, and a source terminal 356 coupled to a node 360. Finally, an NMOS transistor 364 has a drain terminal 368 and a gate terminal 372 together coupled to node 360, and a source terminal 376 coupled to the substrate $V_{bb}$. All the NMOS transistors, 324, 344, and 364 are relatively wide, short channel transistors.

If the substrate voltage is more negative than three NMOS threshold voltages below $V_{ref}$ (ground), there will be conduction through transistors 304, 324, 344 and 364 between the positive supply $V_{cc}$ and the negative substrate $V_{bb}$. In this case, transistor 364 will prevent node 360 from rising above $V_{bb}$ plus one NMOS threshold voltage, and transistor 344 will prevent node 340 from rising more than one NMOS threshold voltage above that, i.e. $V_{bb}+2$ ($V_{tn}$). With the source voltage of NMOS transistor 324 ($V_{bb}+2(V_{tn})$) its gate voltage $V_{ref}$ is one and transistor 324 pulls node 320 down to essentially the voltage on node 340, i.e. $V_{bb}+2$ ($V_{tn}$). This voltage, below ground, is one logic state for the output on node 320 signifying that no pumping is necessary.

If, on the other hand, $V_{bb}$ is less than (more positive voltage than) 3 NMOS threshold voltages below $V_{ref}$ (ground), then diode connected transistors 364 and 344 cannot pull node 340 low enough to cause conduction through transistor 324. In this case, there is no current through the circuit and PMOS transistor 304 pulls node 320 up to $V_{cc}$. This $V_{cc}$ level on node 320 is the other logic state for the output on node 320, signifying that pumping is necessary. The signal at node 320 is communicated to the charge pump. The charge pump turns on for transferring charge to the substrate when node 320 is at ($V_{cc}$) volts, and the charge pump is turned off when node 320 is at $V_{bb}+2$ ($V_{tn}$). Unfortunately, whenever $V_{bb}$ is low enough to turn off the charge pump, there is current flowing through comparator 300 into the substrate. Thus, the comparator 300 itself causes a substrate current which must be pumped away. The substrate voltage comparison circuitry according to the present invention avoids this problem.

Figure 12:
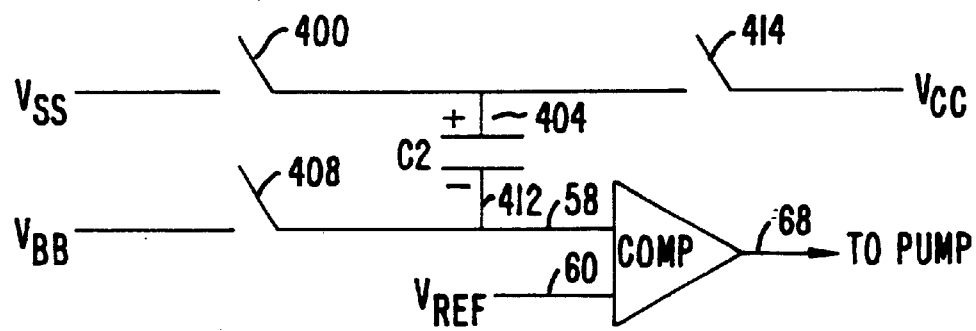
FIG. 12 is a conceptual schematic diagram of a particular embodiment of a substrate voltage detector according to the present invention.

FIG. 12 is a conceptual schematic diagram of a particular embodiment of substrate voltage comparison circuitry according to the present invention. A switch 400 is coupled between ground ($V_{ss}$) and a terminal 404 of a capacitance C2. A switch 408 is coupled between the substrate voltage $V_{bb}$ and a terminal 412 of capacitance C2. A switch 414 is coupled between the power supply voltage ($V_{cc}$) and terminal 404 of capacitance C2, and one input terminal 418 of comparator 56 is coupled to terminal 412 of capacitance C2 via bus 58. As noted previously, the other input terminal of comparator 56 is coupled to reference voltage ($V_{ref}$) through bus 60.

The purpose of the switch and capacitance circuitry shown in FIG. 12 is to translate the substrate voltage $V_{bb}$ to a level which may be compared by comparator 56. Initially, switches 400 and 408 are closed for charging capacitance C2 to a voltage equal to ($V_{ss}-|V_{bb}|$). Thereafter, switches 400 and 408 are opened. Switch 414 is then closed which causes terminal 404 of capacitance C2 to rise from $V_{ss}$ to $V_{cc}$. This, in turn, causes the voltage at terminal 412 to rise from $V_{bb}$ to $V_{bb}+V_{cc}$, assuming $V_{ss}$ equals 0 volts. If $V_{cc}$ equals +5 volts, and if $V_{bb}$ is more positive than –5 volts, then the voltage on bus 58 is now a positive voltage which may be conveniently compared by comparator 56. After the voltage on bus 58 is compared by comparator 56, switch 414 is opened and switch 400 is closed. Terminal 404 of capacitance C2 falls to $V_{ss}$, and terminal 412 falls to $V_{bb}$. Switch 408 then may be closed with no transfer of charge to or from the substrate. The circuit thus operates without the disadvantage discussed for known comparators.

SUBSTRATE VOLTAGE TRANSLATOR

Figure 14:
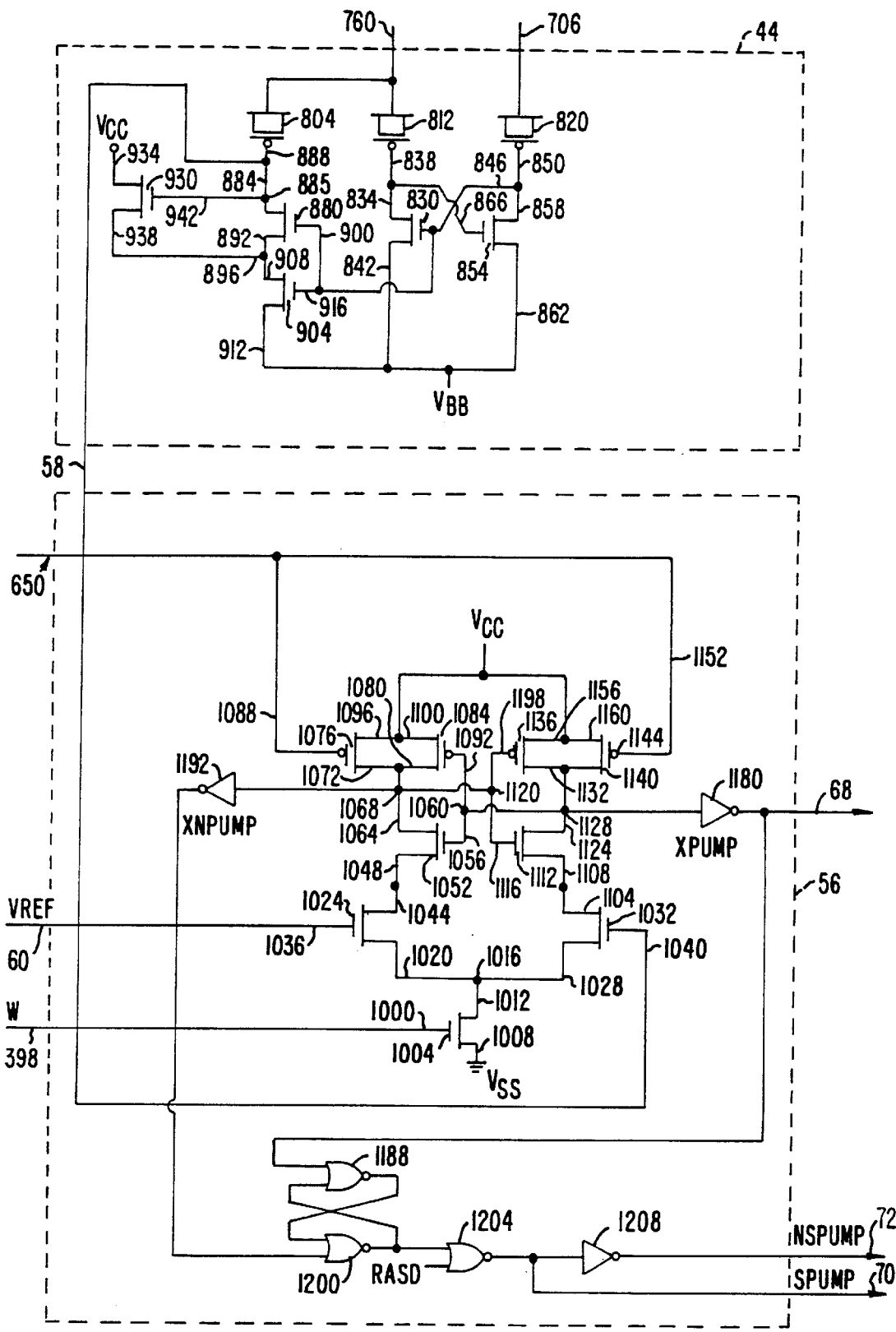
FIG. 14 is a schematic diagram of particular embodiments of the substrate voltage translator and comparator shown in FIG. 2.

FIG. 14 is a schematic diagram of a particular embodiment of substrate voltage translator 44 and comparator 56. Voltage level translator 44 corresponds to the switch and capacitor of FIG. 12, while comparator 56 of FIG. 14 more or less corresponds to comparator 56 of FIG. 12. Referring to the substrate voltage translator 44 portion of FIG. 14, line 760 is coupled to source and drain terminals of PMOS transistors functioning as capacitances 804 and 812. Similarly, line 706 is coupled to source and drain terminals of a PMOS transistor functioning as a capacitance 820. An NMOS transistor 830 has a drain terminal 834 coupled to a gate terminal 838 of capacitance 812, a source terminal 842 coupled to the substrate $V_{bb}$, and a gate terminal 846 coupled to a gate terminal 850 of capacitance 820. An NMOS transistor 854 has a drain terminal 858 coupled to gate terminal 850 of capacitance 820, a source terminal 862 coupled to $V_{bb}$, and a gate terminal 866 coupled to gate terminal 838 of capacitance 812. The circuit described thus far operates in the same manner as in the circuit shown in FIG. 13 except all polarities are reversed. The voltage on gate terminals 838 and 850 swing between $V_{bb}$ and $V_{bb}+V_{cc}$ volts as nodes 760 and 706 swing between $V_{ss}$ (0 volts) and $V_{cc}$. That is, when terminal 838 is high as a result of a high (e.g., +5 volts) signal on line 760, transistor 854 turns on pulling gate terminal 850 to $V_{bb}$ during which time the signal on line 706 is low. Thereafter, the signal on line 760 goes low turning off transistor 854. Then when the signal on line 706 goes high (e.g., +5 volts), the voltage on gate terminal 850 rises to $V_{bb}$ +5 volts, turning on transistor 830 and pulling gate terminal 838 to $V_{bb}$.

An NMOS transistor 880 has a drain terminal 884 coupled to a gate terminal 888 of capacitance 804 and to a node 885, a source terminal 892 coupled to a node 896, and a gate terminal 900 coupled to gate terminal 850 of capacitance 820. Another NMOS transistor 904 has a drain terminal 908 coupled to node 896, a source terminal 912 coupled to $V_{bb}$, and a gate terminal 916 coupled to gate terminal 850 of capacitance 820. Finally, an NMOS transistor 930 has a drain terminal 934 coupled to $V_{cc}$, a source terminal 938 coupled to node 896, and a gate terminal 942 coupled to node 885.

The switches and capacitor of FIG. 12 correspond to the following transistors of FIGS. 13 and 14. Switches 400 and 414 of FIG. 12 correspond to the NMOS and PMOS transistors respectively of inverter 754 of FIG. 13 which generates node 760. Capacitor CZ of FIG. 12 corresponds to capacitor (PMOS transistor) 804 of FIG. 14. Switch 408 of FIG. 12 corresponds to the series combination of NMOS transistors 880 and 904 of the substrate voltage translator 44 in FIG. 14. The translated substrate voltage on bus 58 of FIG. 12 corresponds to the translated substrate voltage bus 58 of FIG. 14.

As previously discussed, the voltages on the gate terminals of capacitors (PMOS transistors) 812 and 820 alternate between $V_{bb}$ and ($V_{bb}+V_{cc}$). When node 706 is high, node 760 is low. At this time gate terminal 850 of capacitor 850 is at ($V_{bb}+V_{cc}$), turning on transistors 880 and 904, pulling node 885 to $V_{bb}$. Then when node 706 goes low, the gate terminal 850 of capacitor 820 returns to $V_{bb}$, and transistors 880 and 904 hopefully turn off. Finally node 760 rises to $V_{cc}$ and node 885 is driven to ($V_{bb}+V_{cc}$) as the translated substrate voltage on bus 58 to comparator 56. To maintain integrity of this ($V_{bb}+V_{ss}$) voltage between the time node 885 rises and the time comparator 56 is sensed, it is important that the voltage on node 885 not be allowed to leak off. But NMOS transistor 904 has its source at $V_{bb}$ and has no back bias or body effect to raise its threshold voltage as do NMOS transistors whose source is at $V_{ss}$, well above the $V_{bb}$ potential. Without any body effect, transistor 904 may not shut off completely. That is, it may have a small leakage current even when its gate terminal is at $V_{bb}$. Transistors 880 and 930 are included to prevent this problem from leaking charge off node 885. When node 885 rises to ($V_{bb}+V_{cc}$), source follower NMOS transistor 930 pulls node 896 up to a voltage of [($V_{bb}+V_{cc}$)−$V_{tn}$]. Transistor 880, with its source 892 well above $V_{bb}$ and its gate 900 at $V_{bb}$, is fully off and has totally negligible leakage current. Therefore as node 885 rises to ($V_{bb}+V_{cc}$), its level remains intact, and substrate voltage translator 44 provides a voltage level of ($V_{bb}+V_{cc}$) into comparator 56.

The reference voltage $V_{ref}$ on bus 60 into comparator 56 of FIG. 14 may be generated by a simple capacitive divider (not shown). If, for example, two capacitors are in series between ground and a node that switches from ground to $V_{cc}$, the intermediate node (between the capacitors) will switch by a fraction of $V_{cc}$ depending on the ratio of the capacitances. The intermediate node is discharged to ground (by an NMOS transistor) when the switching node is at ground. Thus the voltage on the intermediate node switches up to a fraction of $V_{cc}$ depending on the capacitance ratio. This reference voltage is compared to the ($V_{bb}+V_{ss}$) voltage provided by substrate voltage translator 44. If these capacitors are of equal value, then this intermediate node voltage is $V_{cc}/2$. In this case the regulator will turn on the charge pump whenever $V_{bb}$ is more positive than −($V_{cc}$)/2 and turn it off otherwise. That is, the regulator will strive to maintain a substrate voltage such that the voltage on bus 58=($V_{bb}+V_{cc}$)=½($V_{cc}$)=$V_{ref}$, or ($V_{bb}$)=−½($V_{cc}$).

COMPARATOR

The translated substrate voltage signal on bus 58 is communicated to comparator 56 where it is compared to the reference voltage $V_{ref}$ received on bus 60. The comparison is triggered by the signals on "W" signal line 398 from timing signal generator 34. In this embodiment, the W signals occur once per oscillator cycle to provide the once-per-cycle comparison discussed above. If the substrate voltage is more positive than the reference voltage, then a pump activating signal in the form of a positive pulse appears on line 68. Additionally, the differential SPUMP/NSPUMP signals are generated on SPUMP signal line 70 and NSPUMP signal line 72 upon each comparison and remain valid until the next cycle. As noted previously, the SPUMP/NSPUMP signals control PMOS transistor 210 and NMOS transistor 222, respectively, in each oscillator stage (FIG. 8) for setting the oscillator frequency.

The detailed capacity of comparator 56 is shown in FIG. 14. The "W" signals on "W" signal line 398 are communicated to a gate terminal 1000 of an NMOS transistor 1004 for executing the comparison function. NMOS transistor 1004 has a source terminal 1008 coupled to $V_{ss}$ and a drain terminal 1012 coupled to a node 1016. Node 1016 is, in turn, coupled to a source terminal 1020 of an NMOS transistor 1024 and to a source terminal 1028 of an NMOS transistor 1032. A gate terminal 1036 of NMOS transistor 1024 is coupled for receiving the reference voltage $V_{ref}$ (which may be generated via a capacitive divider coupled between $V_{cc}$ and $V_{ss}$ as previously discussed) on bus 60, and a gate terminal 1040 of NMOS transistor 1032 is coupled for receiving the translated substrate voltage on bus 58. NMOS transistor 1024 has a drain terminal 1044 coupled to a source terminal 1048 of an NMOS transistor 1052. NMOS transistor 1052 has a gate terminal 1056 coupled to a node 1060 and a drain terminal 1064 coupled to a node 1068. Node 1068 is coupled to a drain terminal 1072 of a PMOS transistor 1076 and to a drain terminal 1080 of a PMOS transistor 1084. A gate terminal 1088 of PMOS transistor 1076 is coupled to line 650, and a gate terminal 1092 of transistor 1084 is coupled to node 1060. A source terminal 1096 of transistor 1076 and a source terminal 1100 of transistor 1084 are both coupled to $V_{cc}$.

A drain terminal 1104 of transistor 1032 is coupled to a source terminal 1108 of an NMOS transistor 1112. NMOS transistor 1112 has a gate terminal 1116 coupled to a node 1120 (which is coupled to node 1068) and a drain terminal 1124 coupled to a node 1128 (which is coupled to node 1060). Node 1128 is coupled to a drain terminal 1132 of a PMOS transistor 1136 and to a drain terminal 1140 of a PMOS transistor 1144. A gate terminal 1148 of PMOS transistor 1136 is coupled to node 1120, and a gate terminal 1152 of PMOS transistor 1144 is coupled to line 650. A source terminal 1156 of transistor 1136 and a source terminal 1160 of transistor 1144 are both coupled to $V_{cc}$.

Node 1128 is coupled to an input terminal of an inverter 1180 which has an output terminal coupled to bus 68 and to an input terminal of a 2-input NOR gate 1188. Similarly, node 1068 is coupled to an input terminal of an inverter 1192 which has an output terminal coupled to an input terminal of a 2-input NOR gate 1200. An output terminal of NOR gate 1188 is coupled to another input terminal of NOR gate 1200, and an output terminal of NOR gate 1200 is coupled to another input terminal of NOR gate 1188. NOR gates 1188 and 1200 thus function as a latch so that the signals at the output terminals of inverters 1180 and 1192 are maintained until the next comparison function.

The output terminal of NOR gate 1200 is coupled to an input terminal of a 2-input NOR gate 1204. Another input terminal of NOR gate 1204 is coupled for receiving an active high DRAM RAS signal. The output terminal of NOR gate 1204 is coupled to SPUMP (Slow Pump) signal line 70 and to an input terminal of an inverter 1208. An output terminal of inverter 1208 is coupled to NSPUMP signal line 72.

As previously discussed, node 650 from logic voltage level translator 40 in FIG. 13 switches between $V_{cc}$−1.5 volts and $V_{cc}$ as node "W" switches between 0 volts $V_{ss}$ and +1.5 volts, respectively. Refer once again to the comparator 56 in FIG. 14. Between sensing cycles node "W" is low, and NMOS transistor 1004 is off. At this time, signal 650 is also low and PMOS transistors 1076 and 1144 are on, charging nodes 1068 and 1128 up to $V_{cc}$. No current is drawn during this time because there is no conductive path to $V_{ss}$.

When signal "W" transitions high (to +1.5 volts) node 650 also transitions high (to $V_{cc}$). NMOS transistors 1076 and 1144 turn off. As NMOS transistor 1004 turns on, node 1016 transitions low. If the translated substrate voltage ($V_{bb}+V_{cc}$) on bus 58 is at a higher voltage than $V_{ref}$, transistor 1032 starts to conduct before transistor 1024, since their source terminals are connected together. As transistor 1032 conducts, its drain 1104 discharges toward ground faster than the drain of transistor 1024 discharges toward ground. Preceding this, nodes 1068 and 1128 (the gate connections of transistors 1112 and 1052) were each at the same voltage, $V_{cc}$. Thus, as the drain node 1104 of transistor 1032 discharges towards $V_{ss}$, transistor 1112 conducts pulling node 1128 to ground. This turns off NMOS transistor 1052 preventing it from pulling node 1068 to ground while turning on PMOS transistor 1084 to maintain node 1068 at $V_{cc}$. Thus under this condition with the translated substrate voltage ($V_{bb}+V_{cc}$) on bus 58 above the reference voltage, node 1128 goes to ground while node 1068 remains at $V_{cc}$. When node 1128 goes to ground, the output of inverter 1180 goes high (to $V_{cc}$). Note that after this initial switching transient but with nodes W and 650 still high, there is again no current path. There is no current in the right hand side of the circuit because PMOS transistors 1136 and 1144 are both off and there is no current in the left hand side because NMOS transistor 1052 is off. For as long as nodes "W" and 650 remain high, node 1128 remains low and node 68 remains high.

Thus, a positive pulse on "W" (and on bus 650), when node 58 is is above $V_{ref}$, causes a positive pulse on node 68 while the output of inverter 1192 remains at ground. This positive pulse indicates pumping is required. (The translated substrate voltage is too positive.) This pulse does two things. First it provides a single pump cycle on node 68 delivered to the charge pump itself which will be described below. And second, it sets a flip flop comprised of NOR gates 1188 and 1200 into the appropriate state to insure the oscillator will operate at high frequency.

The positive pulse on node 68 causes the output of NOR gate 1188 to go low. This low combined with the low out of inverter 1192 causes the output of NOR gate 1200 to go high. This high maintains the output of NOR gate 1188 low even after the positive pulse on node 68 terminates. Thus the output of NOR gate 1200 remains high (until such time that inverter 1192 provides a high output).

If, instead, the translated substrate voltage ($V_{bb}+V_{cc}$) on bus 58 is below the reference voltage, no pumping is required. In this case, node 1068 pulses to ground while node 1128 remains high. With node 1128 remaining high, there is no change in the low voltage on node 68, and no pump cycle is executed. At the same time, the positive pulse on the output of inverter 1192 causes NOR gate 1200 to have a low output. This low output combined with a low on node 68 causes a high output of NOR gate 1188. The high output of NOR gate 1188 maintains a low on the output of NOR gate 1200 even after the positive pulse on the output of inverter 1192 terminates.

Thus, if the comparator most recently determined that the substrate was too positive (i.e., pumping is required) the output of NOR gate 1200 will be high. If, instead, the comparator most recently determined that the substrate was sufficiently negative (i.e, no pumping required), the output of NOR gate 1200 will be low. The signal RASD is high whenever the circuit is in its active state. For a DRAM, this would be high during an active cycle and low during precharge between cycles. When either the comparator most recently determined that pumping is required or when the circuit is active (RASD is high) then the output of NOR gate 1204 (SPUMP) is low. A low output on SPUMP (Slow Pump) causes the oscillator not to oscillate slow but rather fast. That is, a low on SPUMP turns on PMOS transistor 210 of FIG. 8, while the high out of inverter 1208 (FIG. 14) on NSPUMP turns on NMOS transistor 222 of FIG. 8.

As previously discussed, when transistors 210 and 222 of the oscillator stage of FIG. 8 are turned on, the oscillator operates at high frequency which in turn permits high pumping current. When these transistors are off, the oscillator operates at a much lower frequency, as does the logic voltage level translator 40 of FIG. 13, the substrate voltage translator 44 of FIG. 14 and the comparator 56 of FIG. 14. The low frequency operation of approximately 200 kilohertz, with much of the circuitry operating from a 1.5 volt supply, permits the pump to consume less than 1 microamp of total current when no pumping is required. Yet when pumping is required, the circuit automatically switches to high frequency, and at high frequency is capable of pumping more than 1 milliamp of current out of the substrate.

PUMP SIGNAL GENERATOR

Figure 15:
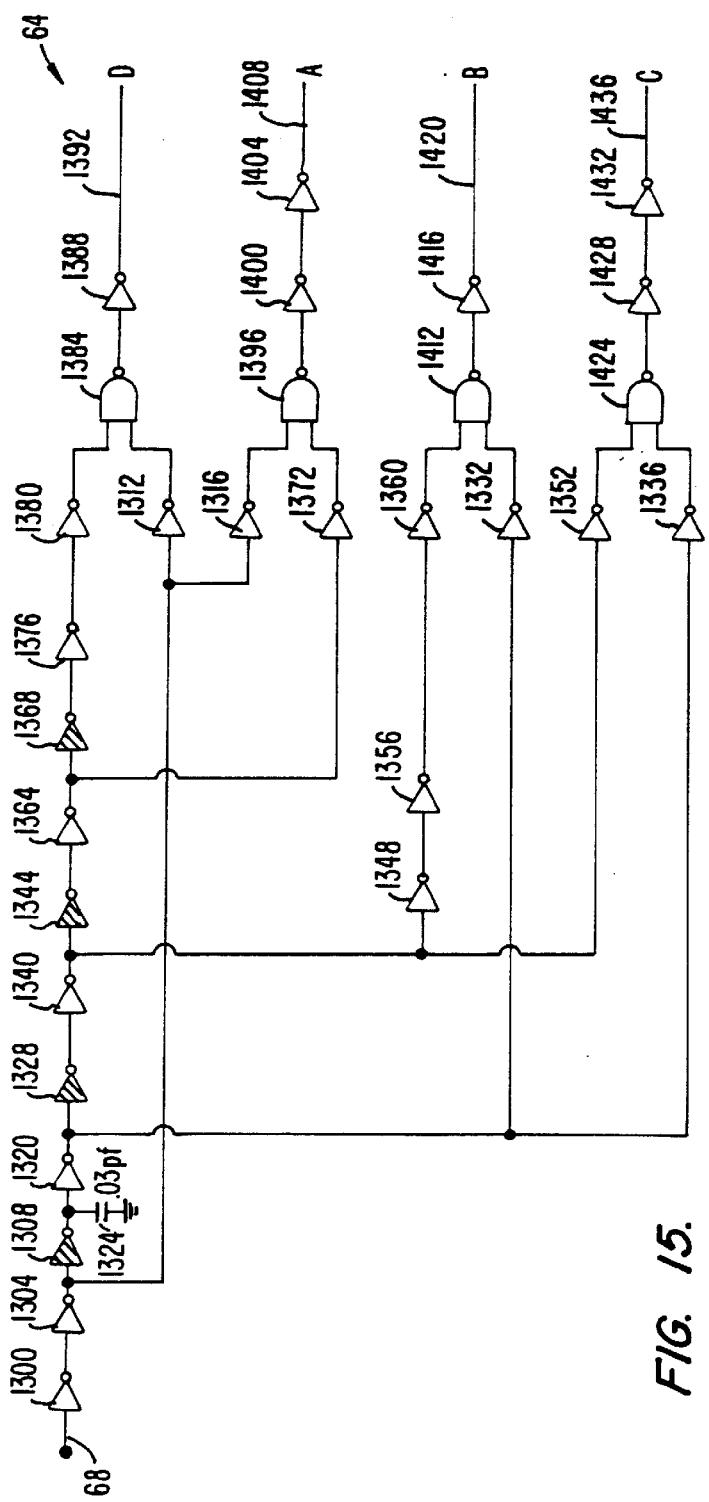
FIG. 15 is a schematic diagram of a particular embodiment of the pump signal generator shown in FIG. 2.

FIG. 15 is a schematic diagram of a particular embodiment of pump signal generator 64. The pump signal received on bus 68 is coupled to an input terminal of an inverter 1300 which has an output terminal coupled to an input terminal of an inverter 1304. An output terminal of inverter 1304 is coupled to an input terminal of an inverter 1308, to an input terminal of an inverter 1312, and to an input terminal of an inverter 1316. An output terminal of inverter 1308 is coupled to an input terminal of an inverter 1320. An output terminal of inverter 1320 is coupled to an input terminal of an inverter 1328, to an input terminal of an inverter 1332, and to an input terminal of an inverter 1336. An output terminal of inverter 1328 is coupled to an input terminal of an inverter 1340. An output terminal of inverter 1340 is coupled to an input terminal of an inverter 1344, to an input terminal of an inverter 1348, and to an input terminal of an inverter 1352. An output terminal of inverter 1348 is coupled to an input terminal of inverter 1356, and the output terminal of an inverter 1356 is coupled to an input terminal of an inverter 1360. An output terminal of inverter 1344 is coupled to an input terminal of an inverter 1364. An output terminal of inverter 1364 is coupled to an input terminal of an inverter 1368 and to an input terminal of an inverter 1372. An output terminal of inverter 1368 is coupled to an input terminal of an inverter 1376, and an output terminal of inverter 1376 is coupled to an input terminal of an inverter 1380.

An output terminal of inverter 1380 is coupled to one input of a 2-input NAND gate 1384. Another input terminal of NAND gate 1384 is coupled to an output terminal of inverter 1312. An output terminal of NAND gate 1384 is coupled to an input terminal of an inverter 1388, and an output terminal of inverter 1388 is coupled to a "D" signal line 1392.

An output terminal of inverter 1316 is coupled to an input terminal of a 2-input NAND gate 1396. Another input terminal of NAND gate 1396 is coupled to an output terminal of a inverter 1372. An output terminal of NAND gate 1396 is coupled to an input terminal of an inverter 1400, and an output terminal of inverter 1400 is coupled to an input terminal of an inverter 1404. An output terminal of inverter 1404 is coupled to an "A" signal line 1408.

An output terminal of inverter 1360 is coupled to an input terminal of a 2-input NAND gate 1412. Another input terminal of NAND gate 1412 is coupled to an output terminal of inverter 1332. An output terminal of NAND gate 1412 is coupled to an input terminal of an inverter 1416, and an output terminal of inverter 1416 is coupled to a "B" signal line 1420.

An output terminal of inverter 1352 is coupled to an input terminal of a 2-input NAND gate 1424. Another input terminal of NAND gate 1424 is coupled to an output terminal of inverter 1336. An output terminal of NAND gate 1424 is coupled to an input terminal of an inverter 1428, and an output terminal of inverter 1428 is coupled to an input terminal of an inverter 1432. An output terminal of inverter 1432 is coupled to a "C" signal line 1436.

As can be seen by inspection, there are an odd number of inverters between node 68 and each input of each of the NAND gates 1384, 1396, 1412 and 1424. Therefore, the output of each of these NAND gates is the same polarity as is node 68. That is, if node 68 is high, these NAND gate outputs are all high. Nodes "B" and "D", each having one inversion after its respective NAND gate, are opposite in polarity to node 68. Nodes "A" and "C", each having two inversions after its respective NAND gate are the same polarity as is node 68.

When node 68 goes high, node "O" goes low after 5 logic delays. That is, in sequence, the output of inverter 1300 goes low, 1304 goes high, 1312 goes low, NAND 1384 out goes high and inverter 1388 out goes low. But when node 68 goes low, node "O" goes high after 13 logic delays. That is, the output of inventer 1300 goes high, 1304 goes low, 1308 goes high, 1320 goes low, 1328 goes high, 1340 goes low, 1344 goes high, 1364 goes low, 1368 goes high, 1376 goes low, 1380 goes high, NAND 1384 out goes low, and finally inverter 1388 goes high.

The various number of inverters in each of the logic paths to generate each of the signals "A", "B", "C", and "D" are chosen to insure that when node 68 transitions high, node "D" transitions low before node "C" transitions high and that when node 68 transitions low, node "C" transitions low before node "D" transitions high. See FIGS. 15 and 16. Furthermore node "A" transitions high before node "B" transitions low and node "B" transitions high before node "A" transitions low. Also, node "D" transitions low before node "B" transitions low and node "B" transitions high before node "D" transitions high.

When no pumping is required, node 68 remains as low as previously discussed, and nodes "A", "B", "C" and "D" don't move. When comparator 56 determines that a pump cycle is required, nodes 68, "A", "B", "C", and "D" execute a single pump cycle with the relative timing indicated in FIG. 16.

CHARGE PUMP

Figure 17:
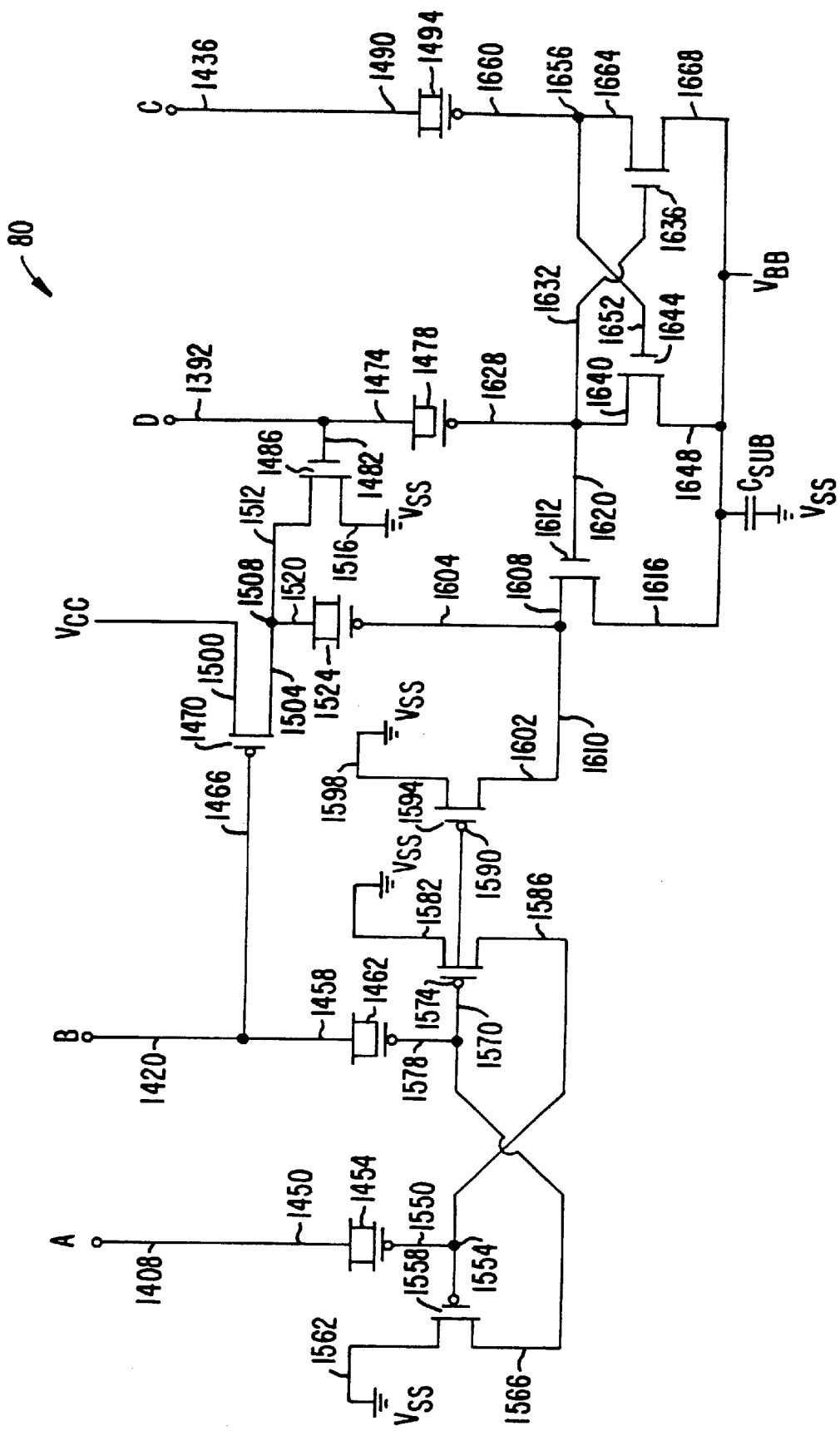
FIG. 17 is a schematic diagram of a particular embodiment of the charge pump shown in FIG. 2.

FIG. 17 is a schematic diagram of a particular embodiment of charge pump 80. "A" signal line 1408 is coupled to a terminal 1450 of a capacitance 1454, and "B" signal line 1420 is coupled to a terminal 1458 of a capacitance 1462. Capacitances 1454 and 1462 each comprise a PMOS transistor having its source and drain terminals coupled together. A gate terminal 1550 of capacitance 1454 is coupled to a gate terminal 1554 of a PMOS transistor 1558. PMOS transistor 1558 has a source terminal 1562 coupled to $V_{ss}$ and a drain terminal 1566 coupled to a gate terminal 1570 of a PMOS transistor 1574 and to a gate terminal 1578 of capacitance 1462. PMOS transistor 1574 has a source terminal 1582 coupled to $V_{ss}$ and a drain terminal 1586 coupled to gate terminal 1554 of transistor 1558. As the signals on "A" signal line 1408 and "B" signal line 1420 swing from 0 volts to +5 volts, the signals on terminals 1550 and 1578 swing from −5 volts to 0 volts, respectively.

"D" signal line 1392 is coupled to a terminal 1474 of a capacitance 1478, and "C" signal line 1436 is coupled to a terminal 1490 of a capacitance 1494. Capacitances 1478 and 1494 each comprise a PMOS transistor having its source and drain terminals coupled together. A gate terminal 1628 of capacitance 1478 is coupled to a gate terminal 1632 of an NMOS transistor 1636. NMOS transistor 1636 has a source terminal 1668 coupled to $V_{bb}$ and a drain terminal 1664 coupled to a gate terminal 1652 of an NMOS transistor 1644 and to a gate terminal 1660 of capacitance 1494. NMOS transistor 1644 has a source terminal 1648 coupled to $V_{bb}$ and a drain terminal 1640 coupled to gate terminal 1628 of capacitance 1478. As the signals on "D" signal line 1392 and "C" signal line 1436 swing from 0 volts to +5 volts, the signals on terminals 1628 and 1660 swing from $V_{bb}$ volts to $V_{bb}$ +5 volts, respectively.

A capacitance 1524 has one terminal 1520 coupled to a node 1508 and a gate terminal 1604 coupled to a node 1610. Capacitance 1524 comprises a PMOS transistor having its source and drain terminals coupled together, and it functions as capacitance C1 in FIG. 1.

A PMOS transistor 1470 has a source terminal 1500 coupled to $V_{cc}$, a gate terminal 1466 coupled to "B" signal line 1420, and a drain terminal 1504 coupled to node 1508. PMOS transistor 1470 functions as switch 4 in FIG. 1. It turns on when "B" signal line 1420 is at 0 volts and turns off when "B" signal line is at +5 volts.

A PMOS transistor 1594 has a source terminal 1598 coupled to $V_{ss}$, a gate terminal 1590 coupled to gate terminal 1578 of capacitance 1462, and a drain terminal 1602 coupled to node 1610. PMOS transistor 1594 functions as switch 8 in FIG. 1. It turns on when its gate terminal 1590 is at −5 volts and turns off when gate terminal 1590 is at 0 volts.

A 50 micron wide NMOS transistor 1486 has a drain terminal 1512 coupled to node 1508, a gate terminal 1482 coupled to "D" signal line 1392, and a source terminal 1516 coupled to $V_{ss}$. NMOS transistor 1486 functions as switch 12 in FIG. 1. It turns on when "D" signal line 1392 is at +5 volts and turns off when "D" signal line 1392 is at 0 volts.

A 350 micron wide NMOS transistor 1612 has a drain terminal 1608 coupled to node 1610, a gate terminal 1620 coupled to terminal 1628 of capacitance 1478, and a source terminal 1616 coupled to $V_{bb}$. NMOS transistor 1612 functions as switch 14 in FIG. 1. It turns on when its gate terminal 1620 is at ($V_{bb}$ +5) volts and turns off when its gate terminal 1620 is at $V_{bb}$ volts.

Figure 1:
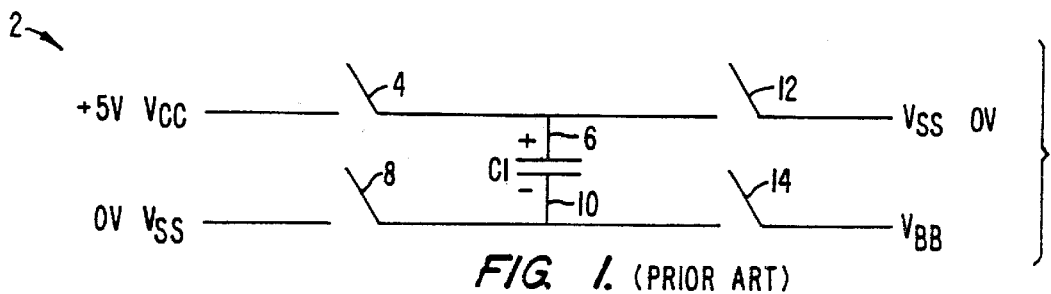
FIG. 1 is a conceptual schematic diagram of a known charge pump.

The signals on "A" signal line 1408, "B" signal line 1420, "C" signal line 1436, and "D" signal line 1392 cause the transistor switches to open and close in the manner discussed for FIG. 1, thus removing positive charge from the substrate as needed.

($V_{bb}$) SWITCH

A unique feature of charge pump 80 is the use of NMOS transistor 1612 as switch 14 for enabling the transfer of charge from terminal 1604 of capacitance 1524 to the substrate. To fully appreciate the inventive aspects of using NMOS transistor 1612 in the manner discussed, a review of known switches for transferring charge to the substrate is in order. In each case, assume $V_{cc}$ is +5.0 volts and $V_{ss}$ is 0.0 volts. Thus, when terminal 1520 of capacitance 1524 is coupled to $V_{ss}$ after the capacitance is charged, terminal 1604 is driven toward −5.0 volts. Also assume $V_{bb}$ is some voltage between 0.0 volts and −5.0 volts.

Figure 18:
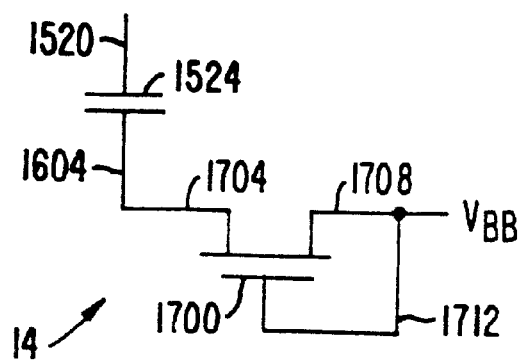
FIG. 18 is a schematic diagram of a known substrate charge switch comprising a diode-connected NMOS transistor.

FIG. 18 is a schematic diagram of a known embodiment of switch 14. In this embodiment, switch 14 comprises a diode-connected NMOS transistor 1700 having a source terminal 1704 coupled to terminal 1604 of capacitance C1, a drain terminal 1708 coupled to the substrate $V_{bb}$, and a gate terminal 1712 coupled to drain terminal 1708. NMOS transistor conducts whenever the voltage on terminal 1604 is $V_{tn}$ below $V_{bb}$. However, it should be noted that the source region of NMOS transistor 1700 is an N-type region located in the P-type substrate. The N-type source and P-type substrate thus form a PN junction. Therefore, as terminal 1604 becomes more negative than $V_{bb}$, the PN junction becomes forward biased. Unless the NMOS threshold voltage $V_{tn}$ is very low, the forward bias of the PN diode is high enough to cause substantial injection of electrons into the P-type substrate. This increases the likelihood of latchup of CMOS devices and creates leakage of charge from the memory nodes in a DRAM. Therefore, use of NMOS transistors for switch 14 has been generally unsuccessful.

Figure 19:
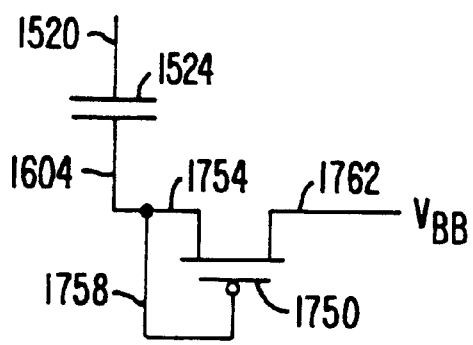
FIG. 19 is a schematic diagram of a known substrate charge switch comprising a diode-connected PMOS transistor.

FIG. 19 is a schematic diagram of another known embodiment of switch 14. In this embodiment, switch 14 comprises a diode-connected PMOS transistor 1750 having a drain terminal 1754 coupled to terminal 1604 of capacitance 1524, a gate terminal 1758 coupled to drain terminal 1754, and a source terminal 1762 coupled to $V_{bb}$. PMOS transistor 1750 conducts whenever the voltage on terminal 1604 is one $|V_{tp}|$ below $V_{bb}$, and no electrons are injected into the substrate. However, the fact that terminal 1604 must be driven one $|V_{tp}|$ below $V_{bb}$ to establish conduction means that as comparator 1524 drives node 1604 to −5 volts, the substrate, $V_{bb}$ is only driven to −4.2 volts if $|V_{tp}|$=0.8 volts. Thus, the pump is not very efficient. Yet, this configuration is widely used.

Figure 20:
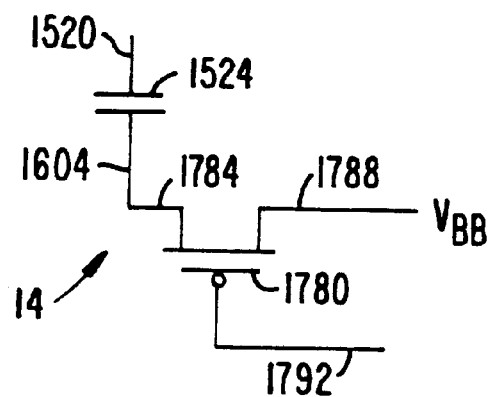
FIG. 20 is a schematic diagram of a particular embodiment of a substrate charge switch comprising a serially connected PMOS transistor.

FIG. 20 is a schematic diagram of a possible embodiment of switch 14 which overcomes the problems noted above. In this embodiment, switch 14 comprises a PMOS transistor 1780 having a first current flowing terminal 1784 coupled to terminal 1604 of capacitance 1524, a second current flowing terminal 1788 coupled to $V_{bb}$, and a gate terminal 1792 for controlling the operation of the transistor. Assume $V_{bb}$ is at −4.9 volts. When terminal 1604 is at −5.0 volts, first current flowing terminal 1784 functions as a drain terminal and second current flowing terminal 1788 functions as a source terminal (since, by definition, the source is positive relative to the drain in PMOS transistors). Assume $|V_{tp}|$=0.8 volts. To turn PMOS transistor 1780 on, a signal of ($V_{bb}$ −0.8) volts (or more negative) must be applied to gate terminal 1792. With $V_{bb}$=−4.9 volts, then a −5.7 volt (or more negative) signal must be applied to gate terminal 1792. When the comparator is being recharged and terminal 1604 is at 0.0 volts, first current flowing terminal 1784 functions as a source terminal and second current flowing terminal 1788 functions as a drain terminal. To turn PMOS transistor 1780 off, a signal of −0.8 volts (or more positive) must be applied to gate terminal 1792. Thus, the signal generator for gate terminal 1792 must produce a signal which must vary by approximately 5 volts or more, which is difficult given a 5 volt power supply. Thus, this circuit is not widely used.

As noted in the discussion of FIG. 17, NMOS transistor 1612 has a drain terminal 1608 coupled to terminal 1604 of capacitance 1524, a source terminal 1616 coupled to $V_{bb}$, and a gate terminal 1620 coupled to terminal 1628 of capacitance 1478. Terminal 1628 of capacitance 1478 provides a signal which swings between $V_{bb}$ and ($V_{bb}+V_{cc}$) for turning NMOS transistor 1612 off and on. NMOS transistor 1612 is substantially wider than NMOS transistor 1486 (e.g., 350 microns vs. 50 microns).

As the "D" signal on node 1392 transitions from 0 volts to the $V_{cc}$ voltage, NMOS transistor 1486 turns on. Simultaneously, capacitor 1478 drives the gate terminal 1620 of NMOS transistor 1612 above the substrate voltage $V_{bb}$, turning transistor 1612 on. The capacitance of capacitor 1478 is much larger than the gate capacitance of transistor 1612. Therefore, at any given instant during the positive switching transition of node "D", the gate of transistor 1612 is almost as much above $V_{bb}$ (the source of transistor 1612) as node "D" (the gate of transistor 1486) is above $V_{ss}$ (the source of transistor 1486). The threshold voltage of transistor 1486 is increased by its body effect; that is, by the fact that its source voltage (0 volts) is above its substrate voltage, $V_{bb}$. The threshold voltage of transistor 1612 is not increased by body effect since its source is connected to the common substrate of all NMOS transistors $V_{bb}$. Thus, the threshold voltage of transistor 1486 is greater than the threshold voltage of transistor 1612. As node "D" rises, transistor 1612 starts to turn on before transistor 1486 starts to turn on because of its lower threshold voltage (assuming capacitor 1478 is large enough).

During any arbitrary time during the rise of node "D" (including the final voltage of $V_{cc}$), transistor 1486 conducts a current no greater than its saturation current at that gate voltage. The saturation current of transistor 1486 pulls node 1508 toward 0 volts, providing a displacement current through capacitor 1524, trying to drive node 1610 below the substrate $V_{bb}$. At this time, transistor 1612 has close to the same gate-to-source voltage as does transistor 1486. And most importantly, transistor 1612 is, for example, seven times as wide as is transistor 1486 (e.g., 350 microns vs. 50 microns).

Transistor 1612 is designed to have a low resistance, by making it very wide. Its resistance is low enough that the saturation current through transistor 1486 (and through capacitor 1524) can only develop a voltage of about 0.3 volts across transistor 1612. Thus, node 1610 is never driven more than 0.3 volts below the substrate voltage $V_{bb}$. Although the first current flowing terminal 1608 of NMOS transistor 1612 is driven negative with respect to the substrate, forward biasing the P-N diode, the injection current is totally negligible. It takes about 0.7 volts of forward bias to get substantial current through a silicon P-N diode. Every 60 millivolts reduction in forward bias decreases the current by a factor of 10. At a forward bias of 0.3 volts, 400 mv below 0.7 volts, the current is more than one million times smaller than it would be at a forward bias at 0.7 volts.

Thus, by designing transistor 1612 to have a much greater width than that of transistor 1486 and by designing capacitor 1478 to have a much greater capacitance than that of the gate of transistor 1612, forward bias injection current is made completely negligible. Yet, this is accomplished with the gate terminal 1620 of transition 1612 only switching from $V_{bb}$ to ($V_{bb}+V_{cc}$), and without the drop of a threshold voltage across transistor 1612. The lack of a threshold drop makes pump 80 substantially more efficient than prior-art pumps, using less $V_{cc}$ current to obtain a given substrate pump current, and achieving greater pump current for a given capacitor 1524 size.

Figure 16:
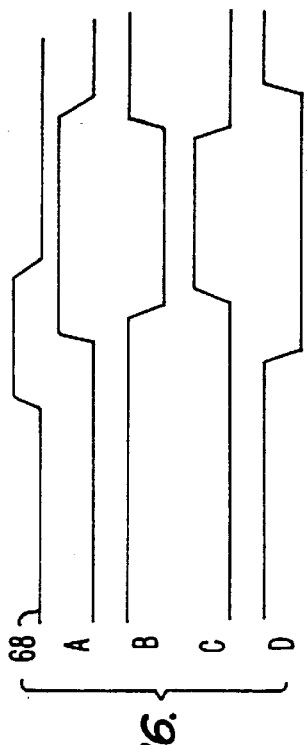
FIG. 16 is a timing diagram illustrating the timing of the input signal and of the signals generated by the pump signal generator shown in FIG. 15.

With no body effect, NMOS transistor 1612 may not completely turn off even with its gate voltage equal to its source voltage of $V_{bb}$. Therefore, during standby, when no pumping is taking place, node "D" is high so that transistor 1612 is on. At this time, node "B" is high, and PMOS transistor 1594 is off with negligible leakage current, as is PMOS transistor 1470. That is, the standby condition is that shown at the start or end of FIG. 16. The substrate is actually pumped negative after node "D", FIG. 16, rises. Any leakage current through transistor 1612 only remains during the pump cycle pulse during which time capacitor is being charged and node "D", FIG. 16, is low. This leakage current, multiplied by the pulse width, gives a leakage charge per pump cycle. Because the leakage is low and the pulse width is low (perhaps 20 nanoseconds), the leakage charge per cycle is very low, negligible compared to the pump charge per cycle. If the pump were instead stopped with node "D", low and transistor 1612 presumably off but possibly slightly on and PMOS transistor 1594 definitely on, there could be a substantial leakage path from the substrate to ground.

Finally, when terminal 1604 is driven below $V_{bb}$, first current flowing terminal 1608 functions as a source terminal and second current flowing terminal 1616 functions as a drain terminal (since, by definition, the drain is positive relative to the source in NMOS transistors). Assume $V_{tn}=0.8$ volts and $V_{bb}=-4.9$ volts. To turn NMOS transistor 1612 on, a signal of −4.1 volts (or more positive) must be applied to gate terminal 1620. When terminal 1604 is at 0.0 volts, first current flowing terminal 1608 functions as a drain terminal and second current flowing terminal 1616 functions as a source terminal. To turn NMOS transistor 1612 off, a signal of ($V_{bb}$+0.8) volts (or more negative) must be applied to gate terminal 1620. That is, a voltage more positive than −4.1 volts turns transistor 1612 on while a voltage more negative than −4.1 volts turns it off. Thus, the voltage need not switch by an amount close to an above as was required for a PMOS transistor switch doing the job of NMOS transistor 1612. Instead, a voltage charge less than $V_{cc}$ is more than adequate.

In conclusion, a number of independent innovations together provide the full benefits that have been taught herein. Each makes its own contribution and taken alone, advances the prior art. Used together, they provide a pump consuming very low standby power, yet capable of pumping high current and also capable of achieving, with a one stage pump, a substrate voltage almost as far below ground as the positive supply $V_{cc}$ is above ground. The various innovative circuit techniques disclosed herein include: operating the pump oscillator from a reduced supply voltage to save power; increasing this reduced supply voltage level if substrate is not reasonably negative; operating the pump oscillator at a low frequency when pumping is not necessary to save power and at a high frequency when pumping may be necessary to achieve high pump current; translating the low voltage swing logic nodes to high voltage swing nodes without any power-consuming direct current paths; translating the $V_{bb}$ voltage up to ($V_{bb}+V_{cc}$) with a capacitor and switches to provide for easy comparison to a reference voltage to determine if pumping is needed; employing an NMOS transistor 1612 of FIG. 17 for switch 14 of FIG. 1; limiting the voltage developed across this transistor to an acceptable level in which P-N diode injection current is negligible; providing that transistor 1612 of FIG. 17 remains on during the potentially long time periods between pump cycles so that any off leakage current that may be present has very limited time to pull the substrate high.

While the above is a complete description of specific embodiments of the present invention, various modifications may be employed. For example, assumed voltages and the sizes of the various transistors may vary without departing from the principles of operation. Consequently, the scope of the invention should not be limited except as described in the claims.

What is claimed is:

1. An apparatus for translating voltages comprising:
control signal means for generating first and second mutually exclusive low voltage control signals;
a first capacitance having a first terminal coupled for receiving the first control signal;
a second capacitance having a first terminal coupled for receiving the second control signal;
a first transistor having a first current flowing terminal coupled to a high voltage current source, a second current flowing terminal coupled to a second terminal of the first capacitance, and a control terminal coupled to a second terminal of the second capacitance;
a second transistor; having a first current flowing terminal coupled to the high voltage current source, a second current flowing terminal coupled to the second terminal of the second capacitance, and a control terminal coupled to the second terminal of the first capacitance;
wherein the second transistor conducts current when the first control signal is received by the first capacitance; and
wherein the first transistor conducts current when the second control signal is received by the second capacitance,
a third transistor having a first current flowing terminal coupled to the high voltage current source, a control terminal coupled to the second terminal of the first capacitance, and a second current flowing terminal;
a fourth transistor having a first current flowing terminal coupled to the second current flowing terminal of the third transistor, a second current flowing terminal coupled to a ground potential, and a control terminal coupled to the first terminal of the first capacitance;
wherein one of the third or fourth transistor conducts when the first signal is received by the first capacitance; and
wherein the other of the third or fourth transistor conducts when the second signal is received by the second capacitance.

2. The apparatus according to claim 1 wherein the first control signal comprises a low portion and a high portion, wherein the second control signal comprises a low portion and a high portion, and wherein the low portion of the first control signal is mutually exclusive with the low portion of the second control signal.

3. The apparatus according to claim 2 wherein the low portion of the first and second control signals are each approximately zero volts, and wherein the high portion of the first and second control signals are each approximately 1.5 volts.

4. The apparatus according to claim 3 wherein the first and second transistors each comprise PMOS transistors.

5. The apparatus according to claim 4 wherein the third transistor comprises a PMOS transistor and the fourth transistor comprises a NMOS transistor.

6. The apparatus according to claim 5 wherein the high voltage current source is approximately five volts.

7. An apparatus for translating a substrate voltage comprising:
control signal means for generating first and second mutually exclusive low voltage control signals;
a first capacitance having a first terminal coupled for receiving the first control signal;
a second capacitance having a first terminal coupled for receiving the second control signal;
a first transistor having a first current flowing terminal coupled to a high voltage current source, a second current flowing terminal coupled to a second terminal of the first capacitance, and a control terminal coupled to a second terminal of the second capacitance;
a second transistor having a first current flowing terminal coupled to the high voltage current source, a second current flowing terminal coupled to the second terminal of the second capacitance, and a control terminal coupled to the second terminal of the first capacitance;
wherein the second transistor conducts current when the first control signal is received by the first capacitance;
wherein the first transistor conducts current when the second control signal is received by the second capacitance;

a third transistor having a first current flowing terminal coupled to the high voltage current source, a control terminal coupled to the second terminal of the first capacitance, and a second current flowing terminal;

a fourth transistor having a first current flowing terminal coupled to the second current flowing terminal of the third transistor at a first node, a second current flowing terminal coupled to a ground potential, and a control terminal coupled to the first terminal of the first capacitance;

wherein one of the third or fourth transistor conducts when the first control signal is received by the first capacitance;

wherein the other of the third or fourth transistor conducts when the second control signal is received by the second capacitance;

a fifth transistor having a first current flowing terminal coupled to the high voltage current source, a control terminal coupled to the second terminal of the second capacitance, and a second current flowing terminal;

a sixth transistor having a first current flowing terminal coupled to the second current flowing terminal of the fifth transistor at a second node, a second current flowing terminal coupled to a ground potential, and a control terminal coupled to the first terminal of the second capacitance;

wherein one of the fifth or sixth transistor conducts when the first control signal is received by the first capacitance;

wherein the other of the fifth or sixth transistor conducts when the second control signal is received by the second capacitance;

a third capacitance having a first input terminal coupled to the first node;

a fourth capacitance having a first input terminal coupled to the second node;

a seventh transistor having a first current flowing terminal coupled to a second input terminal of the third capacitance, a second current flowing terminal coupled to the substrate, and a control terminal coupled to a second terminal of the fourth capacitance;

an eighth transistor having a first current flowing terminal coupled to the second input terminal of the fourth capacitance, a second current flowing terminal coupled to the substrate, and a control terminal coupled to the second terminal of the third capacitance;

wherein the seventh transistor conducts current when the fifth transistor conducts;

wherein the eighth transistor conducts when the third transistor conducts;

wherein a voltage at the second input terminal of the fourth capacitance is approximately equal to the substrate voltage when the eighth transistor conducts; and wherein a voltage at the second input terminal of the fourth capacitance is approximately equal to the substrate voltage plus the voltage of the high voltage current source.

8. The apparatus according to claim 7 further comprising:

a fifth capacitance having a first input terminal coupled to the first input terminal of the fourth capacitance; and a ninth transistor having a first current flowing terminal coupled to a second input terminal of the fifth capacitance at an output node, a second current flowing terminal coupled to the substrate, and a control terminal coupled to the control terminal of the eighth transistor; and wherein the ninth transistor conducts current when the third transistor conducts current for causing the output node to be at the substrate voltage.

9. The apparatus according to claim 8 further comprising a tenth transistor having a first current flowing terminal coupled to the second input terminal of the fifth capacitance, a second current flowing terminal coupled to the first current flowing terminal of the ninth transistor, and a control terminal coupled to the control terminal of the ninth transistor; and an eleventh transistor having a first current flowing terminal coupled to the high voltage current source, a second current flowing terminal coupled to the first current flowing terminal of the ninth transistor, and a control terminal coupled to the second input terminal of the fifth capacitance.

10. The apparatus according to claim 9 wherein the first control signal comprises a low portion and a high portion, wherein the second control signal comprises a low portion and a high portion, and wherein the low portion of the first control signal is mutually exclusive with the low portion of the second control signal.

11. The apparatus according to claim 10 wherein the first and second transistors each comprise PMOS transistors.

12. The apparatus according to claim 11 wherein the third and fifth transistors each comprise a PMOS transistor and the fourth and sixth transistors each comprise a NMOS transistor.

13. The apparatus according to claim 12 wherein the seventh, eighth, ninth, tenth and eleventh transistors each comprise an NMOS transistor.

14. The apparatus according to claim 13 wherein the low portion of the first and second control signals are each approximately zero volts, and wherein the high portion of the first and second control signals are each approximately 1.5 volts.

15. The apparatus according to claim 14 wherein the high voltage current source is approximately five volts.

16. An apparatus for translating voltages comprising:

a first capacitance having a first terminal coupled for receiving a first control signal;

a second capacitance having a first terminal coupled for receiving a second control signal;

a first transistor and a second transistor having their respective gates and first current-flowing terminals cross-coupled to second terminals of the first and second capacitors, respectively;

wherein each of the control signals comprises a low portion and a high portion, and wherein either the low portion of the first signal is mutually exclusive with the low portion of the second signal or the high portion of the first signal is mutually exclusive with the high portion of the second signal;

a third transistor having a first current flowing terminal coupled to a first voltage, a control terminal coupled to the second terminal of the first capacitance, and a second current flowing terminal;

a fourth transistor having a first current flowing terminal coupled to the second current flowing terminal of the third transistor at a first node; a second current flowing terminal coupled to a second voltage, wherein the second voltage is less than the first voltage; and a control terminal coupled to the first terminal of the first capacitance;

wherein one of the third or fourth transistor conducts when the first signal is received by the first capacitance; and wherein the other of the third or fourth transistor conducts when the second signal is received by the second capacitance.

17. The apparatus of claim 16 wherein the low portion of the first and second control signals are each approximately zero volts, and wherein the high portion of the first and second control signals are each approximately 1.5 volts.

18. The apparatus of claim 17 wherein the first and second transistors each comprise PMOS transistors.

19. The apparatus of claim 18 wherein the third transistor comprises a PMOS transistor and the fourth transistor comprises an NMOS transistor.

20. The apparatus of claim 19 wherein the first voltage is approximately five volts and the second voltage is a ground voltage.

21. The apparatus of claim 16, further comprising:
   a fifth transistor having a first current flowing terminal coupled to the first voltage, a control terminal coupled to the second terminal of the second capacitance, and a second current flowing terminal;
   a sixth transistor having a first current flowing terminal coupled to the second current flowing terminal of the fifth transistor at a second node, a second current flowing terminal coupled to the second voltage, and a control terminal coupled to the first terminal of the second capacitance;
   wherein one of the fifth or sixth transistor conducts when the first control signal is received by the first capacitance;
   wherein the other of the fifth or sixth transistor conducts when the second control signal is received by the second capacitance;
   a third capacitance having a first terminal coupled to the first node;
   a fourth capacitance having a first terminal coupled to the second node;
   a seventh transistor having a first current flowing terminal coupled to a second terminal of the third capacitance; a second current flowing terminal coupled to a third voltage, wherein the third voltage is less than the second voltage; and a control terminal coupled to a second terminal of the fourth capacitance;
   an eighth transistor having a first current flowing terminal coupled to the second terminal of the fourth capacitance, a second current flowing terminal coupled to the third voltage, and a control terminal coupled to the second terminal of the third capacitance;
   wherein the seventh transistor conducts current when the fifth transistor conducts;
   wherein the eighth transistor conducts current when the third transistor conducts;
   wherein a voltage at the second terminal of the fourth capacitance is approximately equal to the third voltage when the eighth transistor conducts; and
   wherein a voltage at the second terminal of the fourth capacitance is approximately equal to the third voltage plus the voltage of the high voltage current source.

22. The apparatus of claim 21 wherein the third and fifth transistors each comprise a PMOS transistor and the fourth and sixth transistors each comprise an NMOS transistor.

23. The apparatus of claim 22 wherein the third voltage is a substrate voltage of a substrate.

24. The apparatus of claim 23 wherein the first voltage is approximately five volts and the second voltage is a ground voltage.

25. The apparatus of claim 21 further comprising:
   a fifth capacitance having a first terminal coupled to the first terminal of the fourth capacitance; and
   a ninth transistor having a first current flowing terminal coupled to a second terminal of the fifth capacitance at an output node, a second current flowing terminal coupled to the third voltage, and a control terminal coupled to the control terminal of the eighth transistor;
   wherein the ninth transistor conducts current when the third transistor conducts current for causing the output node to be at a voltage approximately equal to the third voltage.

26. The apparatus of claim 25 further comprising a tenth transistor disposed between the second terminal of the fifth capacitance and the first current flowing terminal of the ninth transistor, the tenth transistor having a first current flowing terminal coupled to the second terminal of the fifth capacitance at the output node, a second current flowing terminal coupled to the first current flowing terminal of the ninth transistor, and a control terminal coupled to the control terminal of the ninth transistor; and
   an eleventh transistor having a first current flowing terminal coupled to the high voltage current source, a second current flowing terminal coupled to the first current flowing terminal of the ninth transistor, and a control terminal coupled to the second terminal of the fifth capacitance.

27. The apparatus of claim 26 wherein the seventh, eighth, ninth, tenth, and eleventh transistors each comprise an NMOS transistor.

* * * * *